United States Patent
Sharon et al.

(10) Patent No.: US 8,429,512 B2
(45) Date of Patent: Apr. 23, 2013

(54) REDUCED COMPLEXITY LDPC DECODER

(75) Inventors: Eran Sharon, Rishon Lezion (IL); Simon Litsyn, Giv'at Shmuel (IL); Idan Alrod, Herzliya (IL)

(73) Assignee: Romat At Tel Aviv University Ltd., Tel Aviv (IL)

( * ) Notice: Subject to any disclaimer, the term of this patent is extended or adjusted under 35 U.S.C. 154(b) by 1014 days.

(21) Appl. No.: 12/404,308

(22) Filed: Mar. 15, 2009

(65) Prior Publication Data

US 2009/0319858 A1 Dec. 24, 2009

Related U.S. Application Data

(60) Provisional application No. 61/074,690, filed on Jun. 23, 2008.

(51) Int. Cl.
    *G06F 11/00* (2006.01)
(52) U.S. Cl.
    USPC ............ 714/799; 714/800; 714/801; 714/767
(58) Field of Classification Search ............... 714/799
    See application file for complete search history.

(56) References Cited

U.S. PATENT DOCUMENTS

| | | |
|---|---|---|
| 7,484,158 B2 | 1/2009 | Sharon et al. |
| 7,539,920 B2 | 5/2009 | Choi |
| 7,590,914 B2 | 9/2009 | Kim et al. |
| 7,707,476 B2 | 4/2010 | Seki |
| 2007/0168833 A1* | 7/2007 | Lestable et al. ............... 714/758 |
| 2008/0092013 A1* | 4/2008 | Hollums ....................... 714/762 |
| 2009/0063931 A1* | 3/2009 | Rovini et al. .................. 714/758 |

OTHER PUBLICATIONS

R.G. Gallager, "Low-Density Parity Check Codes,", Cambridge, MA: MIT Press, 1963, pp. 1-90.
International Search Report and Written Opinion for International Application No. PCT/IB2009/051273, dated Jun. 30, 2009.
Sharon, E., et al.; "Efficient Serial Message-Passing Schedules for LDPC Decoding"; IEEE Transactions on Information Theory; vol. 53; No. 11; Nov. 2007; pp. 4076-4091.
Yeo, E., et al.; "Architectures and Implementations of Low-Density Parity Check Decoding Algorithms"; The 2002 45th Midwest Symposium on Circuits and Systems; vol. 3; Aug. 2002; pp. III-437-III-430.

* cited by examiner

*Primary Examiner* — Scott Baderman
*Assistant Examiner* — Sarai Butler
(74) *Attorney, Agent, or Firm* — Alston & Bird LLP

(57) ABSTRACT

To decode a manifestation of a codeword in which K information bits are encoded as N>K codeword bits, messages are exchanged between N bit nodes and N–K check nodes. During computation, messages are expressed with a full message length greater than two bits. In each iteration, representations of at least some of the exchanged messages are stored. For at least one node, if representations of messages sent from that node are stored, then the representation of one or more of the messages is stored using at least two bits but using fewer bits than the full message length, and the representation of one other message is stored with full message length. Preferably, the messages that are stored using fewer bits than the full message length are messages sent from check nodes.

24 Claims, 17 Drawing Sheets

Initialization:
for all $c \in C, v \in N(c,G)$    $R_{cv} \leftarrow 0$

Iteration:
for all $v \in V$     (Compute bit to check messages)
  for all $c \in N(v,G)$
    $$Q_{vc} \leftarrow P_v + \sum_{c' \in N(v,G)\setminus c} R_{c'v}$$
  end of loop
end of loop
for all $c \in C$     (Compute check to bit messages)
  for all $v \in N(c,G)$
    $$R_{cv} \leftarrow \varphi^{-1}\left(\sum_{v' \in N(c,G)\setminus v} \varphi(Q_{v'c})\right)$$
  end of loop
end of loop
for all $v \in V$     (update final bit estimates)
  $$Q_v \leftarrow P_v + \sum_{c \in N(v,G)} R_{cv}$$
end of loop

Stop Criteria:
for all $v \in V$  $\hat{v} = sign(Q_v)$
if $H \cdot \underline{\hat{v}}^T = 0$, stop
else, *continue to next iteration*

FIGURE 2 (PRIOR ART)

Initialization:

for all $v \in V, c \in C$     $R_{cv} \leftarrow 0$ for all $v \in V$           $Q_v \leftarrow P_v$

Iteration:

for all $c \in C$                     (Serially traversing the check nodes)

$S \leftarrow \sum_{v \in N(c,G)} \varphi(Q_v - R_{cv})$ for all $v \in N(c,G)$ $Q_{vc} \leftarrow Q_v - R_{cv}$         (Sending $Q_{vc}$ messages into the check nodes)

$R_{cv} \leftarrow \varphi^{-1}(S - \varphi(Q_{vc}))$    (Sending $R_{cv}$ messages out from the check nodes)

$Q_v \leftarrow Q_{vc} + R_{cv}$         (updating *a-posteriori* LLRs)

end of loop end of loop

Stop Criteria:

for all $v \in V$   $\hat{v} = sign(Q_v)$

*if* $H \cdot \hat{\underline{v}}^T = 0$, stop

*else, continue to next iteration*

FIGURE 3 (PRIOR ART)

*for* all $v \in V$     (Compute bit to check messages)
  *for* all $c \in N(v,G)$,
    read from ROM matrix the index of $v$ in $N(c,G)$ : $\{v^{idx}\}$ read from RAM2 entry related to check node $c$ : $\left\{ v_{min}^{idx}, |R_c|, R_{cv_{min}}^{max} \right\}$ read from RAM1 entry related to check node $c$ at index $v^{idx}$ : $\{sgn, \varepsilon\}$ // $v_{min}^{idx}$ is index of $v_{min}$ in $N(c,G)$ // $R_c$ is $\varphi_2^{-1}\left[ \sum_{v \in N(c,G)} \varphi_2(Q_{vc}) \right]$ // "sgn" is the sign of $R_{cv}$ // $\varepsilon$ is $|R_{cv}| - |R_c|$

*if* $\left(v^{idx} = v_{min}^{idx}\right)$, $R_{cv}^{new} \leftarrow R_{cv_{min}}^{max}$    [from R-RAM2]

*else*, $\text{sign}\left(R_{cv}^{new}\right) \leftarrow sgn$; $\left|R_{cv}^{new}\right| \leftarrow |R_c| + \varepsilon$

*end* of loop
  *for* all $c \in N(v,G)$, $Q_{vc}^{new} \leftarrow P_v + \sum_{c' \in N(v,G) \setminus c} R_{c'v}^{new}$

*end* of loop
*end* of loop

FIGURE 13

*for* all $c \in C$   (Compute check to bit messages)
  $v_{min} \leftarrow 0$, $Q_{vc_{min}} \leftarrow \infty$, $cnt \leftarrow -1$, $S \leftarrow 0$
  *for* all $v \in N(c,G)$
    read $Q_{vc}$ from Q-RAM, $S \leftarrow S + Q_{vc}$; $cnt \leftarrow cnt+1$
    *if* $\left(Q_{vc} < Q_{vc_{min}}\right)$; $v_{min} \leftarrow cnt$
  *end*
  $R_c \leftarrow \left|\varphi^{-1}(S)\right|$, $cnt \leftarrow 0$,
  *for* all $v \in N(c,G)$
    $R_{cv} \leftarrow \varphi^{-1}(S - Q_{vc})$; $sgn \leftarrow sign(R_{cv})$
    *if* $(cnt = v_{min})$, $R_{cv_{min}}^{max} = |R_{cv}|$ else, $\varepsilon \leftarrow |R_{cv}| - R_c$;
    R-RAM1[index of 'v' in check node 'c'] $\leftarrow sgn, \varepsilon$
  *end* of loop
  $R-RAM2[c\ check\ index] \leftarrow R_c, v_{min}, R_{cv_{min}}^{max}$
*end* of loop

FIGURE 14

REDUCED COMPLEXITY LDPC DECODER

This patent application claims the benefit of U.S. Provisional Patent Application No. 61/074,690, filed Jun. 23, 2008

FIELD AND BACKGROUND OF THE INVENTION

Disclosed herein is a method, and related devices and systems, of reducing the memory required to implement Low-Density Parity-Check (LDPC) decoding with no sacrifice in performance.

Error Correction Codes (ECCs) are commonly used in communication and storage systems. Various physical phenomena occurring both in communication channels and in storage devices result in noise effects that corrupt the communicated or stored information. Error correction coding schemes can be used for protecting the communicated or stored information against the resulting errors. This is done by encoding the information before transmission through the communication channel or storage in the memory device. The encoding process transforms an information bit sequence $i$ into a codeword $v$ by adding redundancy to the information. This redundancy can then be used in order to recover the information from a corrupted codeword $y$ through a decoding process. An ECC decoder decodes the corrupted codeword $y$ and recovers a bit sequence $\hat{i}$ that should be equal to the original information bit sequence $i$ with high probability.

One common ECC class is the class of linear binary block codes. A length N linear binary block code of dimension K is a linear mapping of length K information bit sequences into length N codewords, where N>K. The rate of the code is defined as R=K/N. The encoding process of a codeword $v$ of dimension 1×N is usually done by multiplying the information bit sequence $i$ of dimension 1×K by a generator matrix G of dimension K×N according to $$\underline{v} = \underline{i} \cdot G \quad (1.1)$$

It also is customary to define a parity-check matrix H of dimension M×N, where M=N−K. The parity-check matrix is related to the generator matrix through the following equation:

$$GH^T = \underline{0} \quad (1.2)$$

The parity-check matrix can be used in order to check whether a length N binary vector is a valid codeword. A 1×N binary vector $v$ is a valid codeword if and only if the following equation holds:

$$H \cdot \underline{v}^T = \underline{0} \quad (1.3)$$

In recent years iterative coding schemes have become very popular. In these schemes the code is constructed as a concatenation of several simple constituent codes and is decoded using an iterative decoding algorithm by exchanging information between the constituent decoders of the simple codes. Another family of iterative decoders operates on a code that can be defined using a bipartite graph describing the interconnections between check nodes and bit nodes. In this case, decoding can be viewed as an iterative passing of messages via the edges of the graph.

One popular class of iterative codes is LDPC codes. An LDPC code is a linear binary block code defined by a sparse parity-check matrix H. As shown in FIG. 1, the code can also be defined by a sparse bipartite graph G=(V,C,E) with a set V of N bit nodes, a set C of M check nodes and a set E of edges connecting bit nodes to check nodes. The bit nodes correspond to the codeword bits and the check nodes correspond to parity-check constraints on the bits, or alternatively to the rows of the parity check matrix H. A bit node is connected by edges to the check nodes that the bit node participates with.

LDPC codes can be decoded using iterative message passing decoding algorithms. These algorithms operate by exchanging messages between bit nodes and check nodes via the edges of the underlying bipartite graph that represents the code. The decoder is provided with initial estimates of the codeword bits. The initial estimates are a set of reliability measures. For example, if data are stored in a flash memory, in which the atomic units for holding data are cells, the reliability of each bit is a function of the mapping from a group of bits to a state that is programmed to a flash cell. The reliability of each bit also is a function of the voltage band read from the flash cell. These initial estimates are refined and improved by imposing the parity-check constraints that the bits should satisfy as a valid codeword (according to equation (1.3)). This is done by exchanging information between the bit nodes representing the codeword bits and the check nodes representing parity-check constraints on the codeword bits, using the messages that are passed via the graph edges.

In iterative decoding algorithms, it is common to utilize "soft" bit estimates, which convey both the bit estimate itself and the reliability of the bit estimate.

The bit estimates conveyed by the messages passed via the graph edges can be expressed in various forms. A common measure for expressing a "soft" bit estimate is the Log-Likelihood Ratio (LLR) given by:

$$LLR = \log \frac{Pr(v = 0 \mid \text{current constraints and observations})}{Pr(v = 1 \mid \text{current constraints and observations})} \quad (1.4)$$

where the "current constraints and observations" are the various parity-check constraints taken into account in computing the message at hand and the observations $v$ correspond to measurements (typically of threshold voltage band values, e.g. if the bits represent data stored in a memory device such as a flash memory) of the bits participating in these parity checks. Without loss of generality, LLR notation is used throughout the rest of this document. The sign of the LLR provides the bit estimate (i.e. positive LLR corresponds to bit v=0 and negative LLR corresponds to bit v=1). The magnitude of the LLR provides the reliability of the estimation (i.e. |LLR|=0 means that the estimate is completely unreliable and |LLR|=∞ means that the estimate is completely reliable and the bit value is known).

Usually, the messages passed during the decoding operation via the graph edges between bit nodes and check nodes are extrinsic. An extrinsic message m passed from a node n via an edge e may take into account all the values received on edges connected to node n other than edge e (this is why it is called extrinsic: it is based only on new information).

One example of a message passing decoding algorithm is the Belief-Propagation (BP) algorithm, which is the best algorithm in this family of algorithms.

Let $$P_v = \log \frac{Pr(v = 0 \mid y)}{Pr(v = 1 \mid y)} \quad (1.5)$$

denote the initial decoder estimate for a bit v, based on the received or read symbol y. Note that it is also possible that there is no y observation for some of the bits, in which case there are two possibilities:

First possibility: shortened bits. The bits are known a-priori and $P_v = \pm\infty$ (depending on whether the bit is 0 or 1).

Second possibility: punctured bits. The bits are unknown a-priori and $$P_v |_{punctured\ bit} = \log\frac{Pr(v=0)}{Pr(v=1)} \qquad (1.6)$$

where $Pr(v=0)$ is the a-priori probability that the bit v is 0 and $Pr(v=1)$ is the a-priori probability that the bit v is 1. Assuming the information bits have equal a-priori probabilities to be 0 or 1 and assuming the code is linear it follows that $$P_v |_{symetric,punctured} = \log\frac{1/2}{1/2} = 0 \qquad (1.7)$$

Let:

$$Q_v = \log\frac{Pr(v=0 \mid \underline{y}, H \cdot \underline{v} = 0)}{Pr(v=1 \mid \underline{y}, H \cdot \underline{v} = 0)} \qquad (1.8)$$

where the final decoder estimation for bit v, based on the entire received or read sequence y and assuming that bit v is part of a codeword (i.e. assuming $H \cdot v^T = 0$). Let $Q_{vc}$ denote a message from bit node v to check node c. Let $R_{cv}$ denote a message from check node c to bit node v. The BP algorithm utilizes the following update rules for computing the messages:

The bit node to check node computation rule:

$$Q_{vc} = P_v + \sum_{c' \in N(v,G)\backslash c} R_{c'v} \qquad (2.1)$$

where $N(n,G)$ denotes the set of neighbors of a node n in the graph G.

The check node to bit node computation rule:

$$R_{cv} = \varphi^{-1}\left(\sum_{v' \in N(c,G)\backslash v} \varphi(Q_{v'c})\right) \qquad (2.2)$$

where $$\varphi(x) = \left\{sign(x), -\log\tanh\left(\frac{|x|}{2}\right)\right\}$$

and operations in the $\varphi$ domain are done over the group $\{0,1\} \times R^+$ (this basically means that the summation here is defined as summation over the magnitudes and XOR over the signs). The final decoder estimation for bit v is:

$$Q_v = P_v + \sum_{c' \in N(v,G)} R_{c'v} \qquad (2.3)$$

The order of passing messages during message passing decoding is called the decoding schedule. BP decoding does not imply utilizing a specific schedule—it only defines the computation rules (2.1), (2.2) and (2.3). The decoding schedule does not affect the expected error correction capability of the code. However, the decoding schedule can significantly influence the convergence rate of the decoder and the complexity of the decoder.

The standard message-passing schedule for decoding LDPC code is the flooding schedule, in which in each iteration all the variable nodes, and subsequently all the check nodes, pass new messages to their neighbors. The standard BP algorithm based on the flooding schedule is given in FIG. 2.

The standard implementation of the BP algorithm based on the flooding schedule is expensive in terms of memory requirements. We need to store a total of $2|V|+2|E|$ messages (for storing the $P_v, Q_v, Q_{vc}$ and $R_{cv}$ messages). Moreover, the flooding schedule exhibits a low convergence rate and hence results in higher decoding logic for providing a required error correction capability at a given decoding throughput.

More efficient, serial message passing decoding schedules, are known in the literature. In a serial message passing schedule, either the bit nodes or the check nodes are serially traversed and for each node, the corresponding messages are sent into and out from the node. For example, a serial message passing schedule can be implemented by serially traversing the check nodes in the graph in some order and for each check node $c \in C$ the following messages are sent:

1. $Q_{vc}$ for each $v \in N(c)$ (i.e. all $Q_{vc}$ messages into the node c).
2. $R_{cv}$ for each $v \in N(c)$ (i.e. all $R_{cv}$ messages from node c).

Serial schedules, in contrast to the flooding schedule, enable faster propagation of information on the graph, resulting in faster convergence (approximately two times faster). Moreover, serial schedule can be efficiently implemented with a significant reduction of memory requirements. This can be achieved by using the $Q_v$ messages and the $R_{cv}$ messages in order to compute the $Q_{vc}$ messages on the fly, thus avoiding the need to use an additional memory for storing the $Q_{vc}$ messages. This is done by expressing $Q_{vc}$ as $(Q_v - R_{cv})$ based on equations (2.1) and (2.3). Furthermore, the same memory as is initialized with the a-priori messages $P_v$ is used for storing the iteratively updated $Q_v$ a-posteriori messages. An additional reduction in memory requirements is obtained because in the serial schedule we only need to use the knowledge of $N(c)$ $\forall c \in C$, while in the standard implementation of the flooding schedule we use both data structures $N(c)$ $\forall c \in C$ and $N(v)$ $\forall v \in V$ requiring twice as much memory for storing the code's graph structure. This serially schedule decoding algorithm is shown in FIG. 3.

To summarize, serial decoding schedules have several advantages:

1) Serial decoding schedules speed up the convergence speed by a factor of two compared to the standard flooding schedule. This means that we need only half the decoder logic in order to provide a given error correction capability at a given throughput, compared to a decoder based on the flooding schedule.
2) Serial decoding schedules provide a memory efficient implementation of the decoder. A RAM for storing only $|V|+|E|$ messages is needed (instead of storing $2|V|+2|E|$ messages as in the standard flooding schedule). Half the ROM size for storing the code's graph structure is needed compared to the standard flooding schedule.
3) "On-the-fly" convergence testing can be implemented as part of the computations done during iteration, allowing convergence detection during iteration and decoding termination at any point. This can save on decoding time and energy consumption.

The basic decoder architecture and data path for implementing a serial message passing decoding algorithm is shown in FIG. 4. This architecture includes:

1) Q-RAM: a memory for storing the iteratively updated $Q_v$ messages (initialized as $P_v$ messages).
2) R-RAM: a memory for storing the $R_{cv}$ edge messages.
3) processing units for implementing the computations involved in updating the messages.
4) a routing layer responsible for routing messages from memories to processing units and vice versa.
5) memory for storing the code's graph structure, responsible for memory addressing and for controlling the routing layer's switching.

Iterative coding systems exhibit an undesired effect called error floor, as shown in FIG. 5, in which the Bit Error Rate (BER) at the output of the decoder starts to decrease much more slowly as the "noise", in the communication channel or the memory device that is responsible for the bit errors, becomes smaller. This effect is problematic, especially in memory systems, in which the required decoder output bit error rate should be very small ($\sim 1e^{-15}$). Note that in FIG. 5 the noise increases to the right.

It is well known that the error correction capability and the error floor of an iterative coding system improve as the code length increases (this is true for any ECC system, but especially for iterative coding systems, in which the error correction capability is rather poor at short code lengths). Unfortunately, in iterative coding systems, the memory complexity of the decoding hardware is proportional to the code length; hence using long codes incurs the penalty of high complexity.

Sub-optimal decoding algorithms can be used in order to reduce the decoder complexity, both in terms of memory requirements and logic complexity. However, as a result, the decoder exhibits reduced error correction capability, either in the waterfall region or in the error floor region or in both regions.

SUMMARY OF THE INVENTION

Due to the popularity of message passing decoding techniques and especially with connection to an LDPC codes, the subject of reducing the complexity of the decoder is a field of extensive research. It is an ongoing effort both in the academy and industry to find ways to reduce the amount of memory required to keep the messages and to simplify the computational units in order to keep at minimum both price and power consumption of implementations of decoders in this class of codes with minimal degradation in the error correction capability.

Most conventional LDPC decoding algorithms are targeted to reduce the complexity of the decoder at the expense of degradation in performance. Herein is described a method for implementing the optimal BP decoding algorithm, (i.e. without any loss in performance), while reducing both the memory size requirement and in the same time offering a simple and low complexity fixed point implementation of the processing units minimizing the power consumption and hardware (silicon) footprint in an electrical circuit implementation.

The algorithms described herein decrease the number of stored messages (only $Q_v$ estimates are kept, while $Q_{vc}$ messages are generated on the fly), compress the messages (e.g. keeping only one bit '$\epsilon$' [see later on] for most of the $R_{cv}$ messages), but retain the optimal performance of the belief propagation algorithm.

One embodiment provided herein is a method of decoding a manifestation of a codeword in which K information bits are encoded as N>K codeword bits, the method including: (a) updating estimates of the codeword bits by steps including: in a graph that includes N bit nodes and N−K check nodes, exchanging messages between the bit nodes and the check nodes during at least one message exchange iteration; (b) defining a full message length greater than two bits with which individual messages are expressed during computation; and (c) in each iteration, storing representations of at least a portion of the messages that are exchanged between the bit nodes and the check nodes; wherein, for at least one of the nodes, if representations of the messages that are sent from that node during one of the at least one iteration are stored, then the representation of at least one of the messages is stored using at least two bits but using fewer bits than the full message length.

Another embodiment provided herein is a decoder for decoding a manifestation of a codeword in which K information bits are encoded as N>K codeword bits, including: (a) at least one memory; and (b) at least one processor for decoding the manifestation of the codeword by executing an algorithm for updating estimates of the codeword bits by steps including: (i) in a graph that includes N bit nodes and N−K check nodes, exchanging messages between the bit nodes and the check nodes during at least one message exchange iteration, individual messages being expressed during computation with a full message length greater than two bits, and (ii) storing, in the at least one memory, representations of at least a portion of the messages that are exchanged between the bit nodes and the check nodes, wherein, for at least one of the nodes, if representations of the messages that are sent from that node during one of the at least one iteration are stored, then the representation of at least one of the messages is stored using at least two bits but using fewer bits than the full message length.

Another embodiment provided herein is a memory controller including: (a) an encoder for encoding K information bits as a codeword of N>K codeword bits; and (b) a decoder including: (i) at least one decoder memory; and (ii) at least one processor for decoding a manifestation of the codeword by executing an algorithm for updating estimates of the codeword bits by steps including: (A) in a graph that includes N bit nodes and N−K check nodes, exchanging messages between the bit nodes and the check nodes during at least one message exchange iteration, individual messages being expressed during computation with a full message length greater than two bits, and (B) storing, in the at least one decoder memory, representations of at least a portion of the messages that are exchanged between the bit nodes and the check nodes, wherein, for at least one of the nodes, if representations of the messages that are sent from that node during one of the at least one iteration are stored, then the representation of at least one of the messages is stored using at least two bits but using fewer bits than the full message length.

Another embodiment provided herein is a receiver including: (a) a demodulator for demodulating a message received from a communication channel, thereby providing a manifestation of a codeword in which K information bits are encoded as N>K codeword bits; and (b) a decoder including: (i) at least one memory; and (ii) at least one processor for decoding the manifestation of the codeword by executing an algorithm for updating estimates of the codeword bits by steps including: (A) in a graph that includes N bit nodes and N−K check nodes, exchanging messages between the bit nodes and the check nodes during at least one message exchange iteration, individual messages being expressed during computation with a full message length greater than two bits, and (B) storing, in the at least one memory, representations of at least a portion of the messages that are exchanged between the bit nodes and the check nodes, wherein, for at least one of the nodes, if representations of the messages that are sent from that node during one of the at least one iteration are stored, then the representation of at least one of the messages is stored using at least two bits but using fewer bits than the full message length.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a manifestation of the codeword, and (ii) a decoder including: (A) at least one memory; and (B) at least one processor for decoding the manifestation of the codeword by executing an algorithm for updating estimates of the codeword bits by steps including: (I) in a graph that includes N bit nodes and N−K check nodes, exchanging messages between the bit nodes and the check nodes during at least one message exchange iteration, individual messages being expressed during computation with a full message length greater than two bits, and (II) storing, in the at least one memory, representations of at least a portion of the messages that are exchanged between the bit nodes and the check nodes, wherein, for at least one of the nodes, if representations of the messages that are sent from that node during one of the at least one iteration are stored, then the representation of at least one of the messages is stored using at least two bits but using fewer bits than the full message length.

There are two common representations of LDPC codes. One representation uses a parity check matrix and hence exchanges information via messages between rows and columns of the matrix. The other representation uses the bi-partite graph. It is well know to a person skilled in the art that these representations are equivalent. The above set of embodiments corresponds to the bi-partite graph representation. The following set of embodiments corresponds to the parity check matrix representation.

Another embodiment provided herein is a method of decoding a manifestation of a codeword in which K information bits are encoded as N>K codeword bits, the method including: (a) providing a parity check matrix having N−K rows and N columns; (b) updating estimates of the codeword bits by steps including exchanging messages between the rows and the columns of the matrix during at least one message exchange iteration; (c) defining a full message length greater than two bits with which individual messages are expressed during computation; and (d) storing representations of at least a portion of the messages that are exchanged between the rows and the columns; wherein, for at least one of the rows or columns, if representations of the messages that are sent from that row or column during one of the at least one iteration are stored, then the representation of at least one of the messages is stored using at least two bits but using fewer bits than the full message length.

Another embodiment provided herein is a decoder for decoding a manifestation of a codeword in which K information bits are encoded as N>K codeword bits, including: (a) at least one memory; and (b) at least one processor for decoding the manifestation of the codeword by executing an algorithm for updating estimates of the codeword bits by steps including: (i) providing a parity check matrix having N−K rows and N columns; (ii) exchanging messages between the rows and the columns of the matrix during at least one message exchange iteration, individual messages being expressed with a full message length greater than two bits, and (iii) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

Another embodiment provided herein is a memory controller including: (a) an encoder for encoding K information bits as a codeword of N>K codeword bits; and (b) a decoder including: (i) at least one memory; and (ii) at least one processor for decoding a manifestation of the codeword by executing an algorithm for updating estimates of the codeword bits by steps including: (A) providing a parity check matrix having N−K rows and N columns; (B) exchanging messages between the rows and the columns of the matrix during at least one message exchange iteration, individual messages being expressed during computation with a full message length greater than two bits, and (C) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

Another embodiment provided herein is a receiver including: (a) a demodulator for demodulating a message received from a communication channel, thereby providing a manifestation of a codeword in which K information bits are encoded as N>K codeword bits; and (b) decoder including: (i) at least one memory; and (ii) at least one processor for decoding the manifestation of the codeword by executing an algorithm for updating estimates of the codeword bits by steps including: (A) providing a parity check matrix having N−K rows and N columns; (B) exchanging messages between the rows and the columns of the matrix during at least one message exchange iteration, individual messages being expressed during computation with a full message length greater than two bits, and (C) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a manifestation of the codeword, and (ii) a decoder including:

(A) at least one memory; and (B) at least one processor for decoding the manifestation of the codeword by executing an algorithm for updating estimates of the codeword bits by steps including: (I) providing a parity check matrix having N−K rows and N columns; (II) exchanging messages between the rows and the columns of the matrix during at least one message exchange iteration, individual messages being expressed during computation with a full message length greater than two bits, and (III) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

Two general methods are provided herein for decoding a manifestation of a codeword in which K information bits are encoded as N>K codeword bits. What is decoded is only a manifestation of the codeword, and not the actual codeword, because the codeword might have been corrupted by noise before one of the methods is applied for decoding.

According to the first general method, estimates of the codeword bits are updated iteratively. In a graph that includes N bit nodes and N−K check nodes, messages are exchanged between the bit nodes and the check nodes in one or more message exchange iterations.

The term "message length" is defined herein as the number of bits used to store a message in a memory. A full message length greater than two bits is defined, such that individual messages are expressed during computation with that full message length. For example, in the preferred embodiments described below the full message length used during computation is n+m+1: n integer bits, m fractional bits and one bit to represent the sign of the number.

In each iteration, representations of at least some of the messages that are exchanged between the bit nodes and the check nodes are stored. As understood herein, an "expression" of a number is either the number itself or an approximation of the number. A "representation" of a number is either an expression of the number or information specific to the number from which, possibly in combination with other information that is not specific to the number, the number can be derived. For example, in the preferred embodiments described below, $R_c$ is not specific to any one message $R_{cv}$ so that the bits used to store $R_c$ are not counted among the bits used to store the representations of the $R_{cv}$'s. The bits used to store the indices of the $R_{cv}$'s also aren't counted among the bits used to store representations of the $R_{cv}$'s because the index bits provide no information about the values of the $R_{cv}$'s.

For at least one of the nodes, if representations of the messages that are sent from that node during one of the iterations are stored, then the representation of at least one of the messages is stored using at least two bits but using fewer bits than the full message length. Preferably, the representation of one other message sent from the node in that iteration is stored with the full message length.

Preferably, all the messages sent from that node during the one iteration except the one other message are stored using at least two bits but using fewer bits than the full message length. Also preferably, the message(s) that is/are stored using fewer bits than the full message length is/are stored using exactly two bits. For example, in the preferred embodiments described below, all the $R_{cv}$'s except $R_{cv_{min}}^{max}$ in are stored as a sign bit plus one bit that says whether $|R_{cv}|$ is $|R_c|$ or $|R_c|+1$, while $R_{cv_{min}}^{max}$ is stored with the full message length.

Preferably, the node for which the representation of at least one of the messages is stored using fewer bits than the full message length is a check node. Most preferably, representations of all the messages that are sent from the check nodes during (one of) the iteration(s) are stored. For each check node, the representation of at least one of the messages that is sent from that check node is stored using at least two bits but using fewer bits than the full message length and the representation of one other message that is sent from that check node is stored with the full message length.

Preferably, for each node for which representations of the messages that are sent from that node during (one of) the iteration(s) are stored, the representation of at least one of the messages that is sent from that node is stored using at least two bits but using fewer bits than the full message length and the representation of one other message that is sent from that node is stored with the full message length.

Preferably, for one or more of the nodes, in each iteration in which representations of the messages that are sent from that node are stored, the representation of at least one of the messages is stored using at least two bits but using fewer bits than the full message length and the representation of one other message is stored with the full message length.

Preferably, the messages are exchanged according to a belief propagation algorithm, for example according to a flooding schedule or according to a serial schedule.

According to the second general method, estimates of the codeword bits are updated iteratively. In one or more message exchange iterations, messages are exchanged between the rows and columns of a parity check matrix that has N−K rows and N columns. A full message length greater than two bits is defined, such that individual messages are expressed during computation with that full message length. In each iteration, representations of at least some of the messages that are exchanged between the rows and the columns of the matrix are stored. For at least one of the rows or columns, if representations of the messages that are sent from that row or column during one of the iterations are stored, then the representation of at least one of the messages is stored using at least two bits but using fewer bits than the full message length, and the representation of one other message is stored with the full message length.

A decoder that corresponds to the first or second general method includes one or more memories and one or more processors for decoding the manifestation of the codeword by executing an algorithm that implements the first or second general method, with the representations that are stored being stored in the memory or memories.

A memory controller that corresponds to the first or second general method includes an encoder for encoding K information bits as a codeword of N>K codeword bits and a decoder that corresponds to the first general method. Normally, the memory controller also includes circuitry for storing at least a portion of the codeword in a main memory and for retrieving a manifestation of the code word (portion) from the main memory.

A memory device that corresponds to the first or second general method includes such a memory controller and also the main memory.

A receiver that corresponds to the first or second general method includes a demodulator for demodulating a message received from a communication channel. The demodulator provides a manifestation of a codeword in which K information bits are encoded as N>K codeword bits. Such a receiver also includes a decoder that corresponds to the first or second general method.

A communication system corresponding to the first or second general method includes a transmitter and a receiver. The transmitter includes an encoder for encoding K information bits of a message as a codeword of N>K codeword bits and a modulator for transmitting the codeword via a communication channel as a modulated signal. The receiver is a receiver that corresponds to the first or second general method.

BRIEF DESCRIPTION OF THE DRAWINGS

Various embodiments are herein described, by way of example only, with reference to the accompanying drawings, wherein:

FIG. 2 shows a flooding schedule belief propagation algorithm;

FIG. 3 shows a check node serial schedule belief propagation algorithm;

FIG. 13 presents the variable node processor algorithm for the decoder of FIG. 12;

FIG. 14 presents the check node processor algorithm for the decoder of FIG. 12;

DESCRIPTION OF THE PREFERRED EMBODIMENTS

The principles and operation of LDPC decoding according to the present invention may be better understood with reference to the drawings and the accompanying description.

The following is a description of a fixed point version of the serially scheduled BP decoding algorithm illustrated in FIG. 3 and an associated decoder that has reduced complexity in both memory and logic aspects.

Without loss of generality, we assume that the logarithm base of the LLRs used by the decoder is 2. The general method is not limited to this case, but the base 2 LLRs provide a convenient and efficient implementation of digital circuits of a decoder.

The method is based on the observation that the $R_{cv}$ messages stored in the decoder memory can be compressed and represented more concisely. This observation is supported by the following theorem:

Theorem 1

Let $v_{min} = \underset{v}{\operatorname{argmin}}\{|Q_{vc}|, v \in N(c)\}$ (3.1)

and $R_c = \varphi_2^{-1}\left[\sum_{v \in N(c,G)} \varphi_2(Q_{vc})\right]$

Then $\forall v \neq v_{min} |R_{cv}| - |R_c| \leq 1$

Proof.

In the special case of base-2 LLRs, the function $\phi(x)$ becomes the function $\phi_2(x)$ defined as follows:

$$\varphi_2(x) = \left\{\operatorname{sign}(x), -\log_2 \frac{2^{|x|} - 1}{2^{|x|} + 1}\right\}$$ (3.2)

Let $$\hat{\varphi}_2(|x|) = -\log_2 \frac{2^{|x|} - 1}{2^{|x|} + 1}.$$

Figure 6:
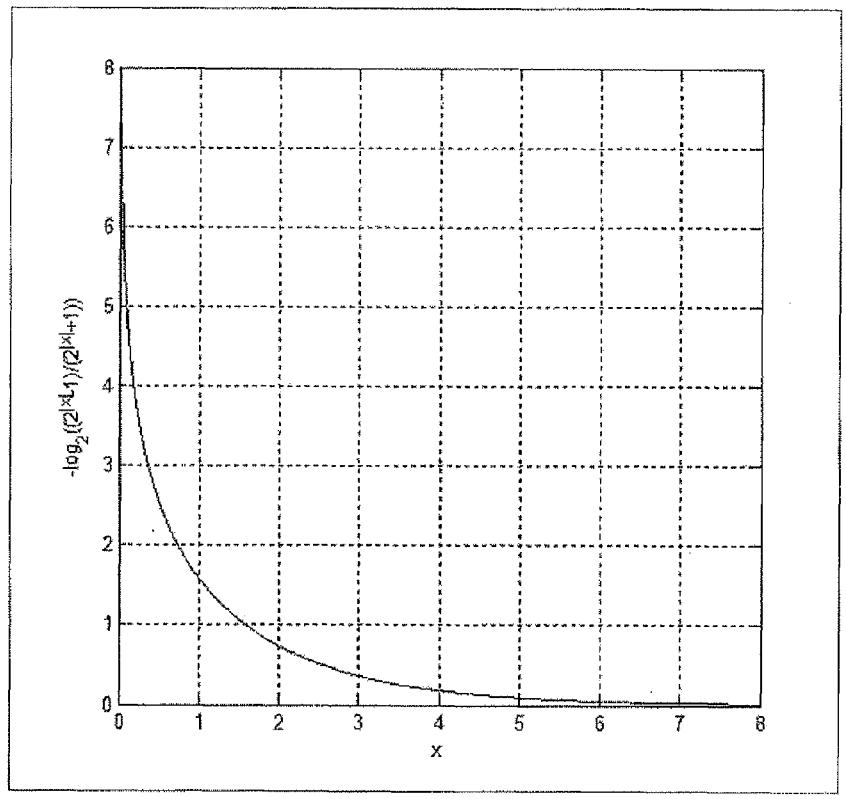
FIG. 6 is a graph of the function $\hat{\phi}_2(|x|)$.

Referring again to the drawings, it can be shown that the function $\hat{\phi}_2(|x|)$, shown in FIG. 6, satisfies the following properties:

(1) $\forall |x| \hat{\varphi}_2(|x|) \geq 0$ (3.3)

(2) $\hat{\varphi}_2(|x|)$ is monotonically decreasing (3) $\lim_{|x| \to \infty} \hat{\varphi}_2(|x|) = 0$ (4) $\lim_{x \to 0} \hat{\varphi}_2(|x|) = \infty$ (5) $\hat{\varphi}_2^{-1}(|x|) = \hat{\varphi}_2(|x|)$ (6) $\max_{|x|} \hat{\varphi}_2\left(\frac{1}{2}|x|\right) - \hat{\varphi}_2(|x|) = 1 \to \forall x, \hat{\varphi}_2\left(\frac{1}{2}|x|\right) - \hat{\varphi}_2(|x|) \leq 1$ The first step in proving the Theorem is to prove the following Lemma:

Given a sum of several elements, if one element that is not the maximal element is excluded from the sum, then the sub-sum (the sum of elements excluding the non maximal element) is at least half of the original sum (sum of all elements).

A mathematical definition of this Lemma is provided as follows:

If $$s = \sum_i s_i$$

then for every $s_j \neq s^{max}\{s_1, s_2, \ldots\}$ the following equation holds:

$$-s_j + \sum_i s_i \geq \frac{1}{2} \cdot \sum_i s_i \quad (3.4)$$

This equation holds for any set of positive values $s_1, s_2, \ldots s_n \geq 2$ and is independent of the function $\phi_2(x)$ defined above.

Proof: We represent the right side of equation (3.4) as a sum of elements other than $s_j$ plus element '$s_j$', the same is done for the left side of equation (3.4):

$$\frac{1}{2} \cdot \sum_i s_i = \frac{s_j}{2} + \frac{1}{2} \cdot \sum_{i \neq j} s_i, \quad (3.5)$$

$$-s_j + \sum_i s_i = -s_j + s_j + \sum_{i \neq j} s_i$$

From (3.5) it is sufficient to prove that:

$$\frac{s_j}{2} + \frac{1}{2} \cdot \sum_{i \neq j} s_i \leq -s_j + s_j + \sum_{i \neq j} s_i \to \frac{s_j}{2} \leq \frac{1}{2} \cdot \sum_{i \neq j} s_i \to s_j \leq \sum_{i \neq j} s_i \quad (3.6)$$

Because $s_j \neq s^{max}$ we can represent the right side of (3.6) as $s^{max}$ plus the other elements in the sum, assuming $s^{max} = s_k$, hence:

$$s_j \leq s^{max} + \sum_{i \neq j, k} s_i \quad (3.7)$$

Equation (3.7) is true because $s^{max}$ by itself is larger than $s_j$ by itself let alone when we add to $s_j$ other positive values.

The second step in proving the theorem is to prove that:

if $a > b \geq a/2$; $a, b \geq 0$ then $\hat{\phi}(b) \leq \hat{\phi}(a) + 1$ (3.8)

Because $\hat{\phi}_2(x)$ is monotonically decreasing, obviously $\hat{\phi}_2(b) \geq \hat{\phi}_2(a)$. So the largest difference between $\hat{\phi}_2(b)$ and $\hat{\phi}_2(a)$ is when 'b' is minimal. So it is therefore sufficient to prove equation (3.8) for $b = a/2$. Now assuming $b = a/2$, proving that $\hat{\phi}_2(b) - \hat{\phi}_2(a) \leq 1$ is equivalent to $$\hat{\phi}_2\left(\frac{a}{2}\right) - \hat{\phi}_2(a) \leq 1,$$

however this is already given as the sixth property of the $\hat{\phi}$ function, already given above, hence equation (3.8) is proven.

The third step of the proof of the theorem is to define $s = \hat{\phi}_2(|R_c|)$, $s - s_j = \hat{\phi}_2(|R_{cv}|)$, $a = R_c$, $b = R_{cv}$. Then, based on the definition of $R_c$ and $R_{cv}$ as in equation (2.2) the following equations hold:

$$\hat{\phi}_2(|R_c|) = \sum_{v' \in N(c,G)} \hat{\phi}_2(|Q_{v'c}|), \quad (4.1)$$

$$\hat{\phi}_2(|R_{cv}|) = \sum_{v' \in N(c,G) \backslash v} \hat{\phi}_2(|Q_{v'c}|)$$

From the definition of $v_{min}$ and the properties of $\hat{\phi}(|x|)$ (see FIG. 6), it is clear that $$\forall v \neq v_{min} \hat{\phi}_2(|Q_{v_{min}c}|) \geq \hat{\phi}_2(|Q_{vc}|) \quad (4.2)$$

which means that $\hat{\phi}_2(|Q_{v_{min}c}|)$ is the maximal element in the sum $$\sum_{v' \in N(c,G)} \hat{\phi}_2(|Q_{v'c}|).$$

From the Lemma provided in the first step (equation 3.4):

$$\forall v \neq v_{min}: -\underbrace{\hat{\phi}_2(|Q_{vc}|)}_{other\ element} + \sum_{v' \in N(c,G)} \hat{\phi}_2(|Q_{v'c}|) \geq \frac{1}{2} \cdot \left[ \sum_{v' \in N(c,G)} \hat{\phi}_2(|Q_{v'c}|) \right]$$

which is equivalent to:

$$\forall v \neq v_{min}:$$

$$\underbrace{\hat{\phi}_2(|Q_{vc}^{min}|)}_{maximal\ element} + \sum_{\substack{v' \in N(c,G), \\ v' \neq v_{min}, v' \neq v}} \hat{\phi}_2(|Q_{v'c}|) \geq \quad (4.3)$$

$$\frac{1}{2} \cdot \left[ \underbrace{\hat{\phi}_2(|Q_{vc}^{min}|)}_{maximal\ element} + \underbrace{\hat{\phi}_2(|Q_{vc}|)}_{other\ element} + \sum_{\substack{v' \in N(c,G), \\ v' \neq v_{min}, v' \neq v}} \hat{\phi}_2(|Q_{v'c}|) \right]$$

From equation (4.3) it is therefore clear that:

$$\forall v \neq v_{min}: \frac{\sum_{v' \in N(c,G), v' \neq v} \hat{\phi}_2(|Q_{v'c}|)}{\sum_{v' \in N(c,G)} \hat{\phi}_2(|Q_{v'c}|)} \geq \frac{1}{2} \quad (4.4)$$

Because $$\forall v \neq v_{min} \frac{\sum_{v' \in N(c,G), v' \neq v} \hat{\phi}_2(|Q_{v'c}|)}{\sum_{v' \in N(c,G)} \hat{\phi}_2(|Q_{v'c}|)} = \frac{\hat{\phi}_2(|R_{cv}|)}{\hat{\phi}_2(|R_c|)} \quad (4.5)$$

Introducing equation (4.4) into equation (4.5) provides:

$$\forall v \neq v_{min} \frac{\hat{\phi}_2(|R_{cv}|)}{\hat{\phi}_2(|R_c|)} \geq \frac{1}{2} \quad (4.6)$$

-continued $$\Rightarrow \forall v \neq v_{min} \hat{\varphi}_2(|R_{cv}|) \geq \frac{1}{2}\hat{\varphi}_2(|R_c|) \quad (4.7)$$

$$\Rightarrow \forall v \neq v_{min}|R_{cv}| \leq \hat{\varphi}_2^{-1}\left(\frac{1}{2}\hat{\varphi}_2(|R_c|)\right)$$

Now define R:

$$\forall v \neq v_{min}: R \underline{\Delta} \hat{\varphi}_2^{-1}\left[\frac{1}{2}\hat{\varphi}_2(|R_c|)\right] - \hat{\varphi}_2^{-1}[\hat{\varphi}_2(|R_c|)] \quad (4.8)$$

Define 'y' as $$y \underline{\Delta} \hat{\varphi}_2(|R_c|) \geq 0 \quad (4.9)$$

Inserting definition (4.9) into definition (4.8) we get:

$$R = \hat{\varphi}_2^{-1}\left(\frac{1}{2}y\right) - \hat{\varphi}_2^{-1}(y) \quad (4.10)$$

Now applying properties (6) and (2) of $\hat{\varphi}_2(|x|)$ in expressions (3.3) to equation (4.10), 'R' defined in definition (4.8) satisfies:

$$R \leq 1 \quad (4.11)$$

We now introduce equations (4.7) into definition (4.8), with property (5) of $\hat{\varphi}_2(|x|)$ in expressions (3.3). The result is:

$$\forall v \neq v_{min}: R \geq |R_{cv}| - \hat{\varphi}_2^{-1}[\hat{\varphi}_2(|R_c|)] = |R_{cv}| - |R_c| \quad (4.12)$$

Combining inequalities (4.11) and (4.12) we get:

$$\forall v \neq v_{min}: |R_{cv}| - |R_c| \leq R \leq 1 \quad (4.13)$$

From inequality (4.13) it is clear that:

$$\forall v \neq v_{min}: |R_{cv}| - |R_c| \leq 1 \quad (4.14)$$

Figure 7:
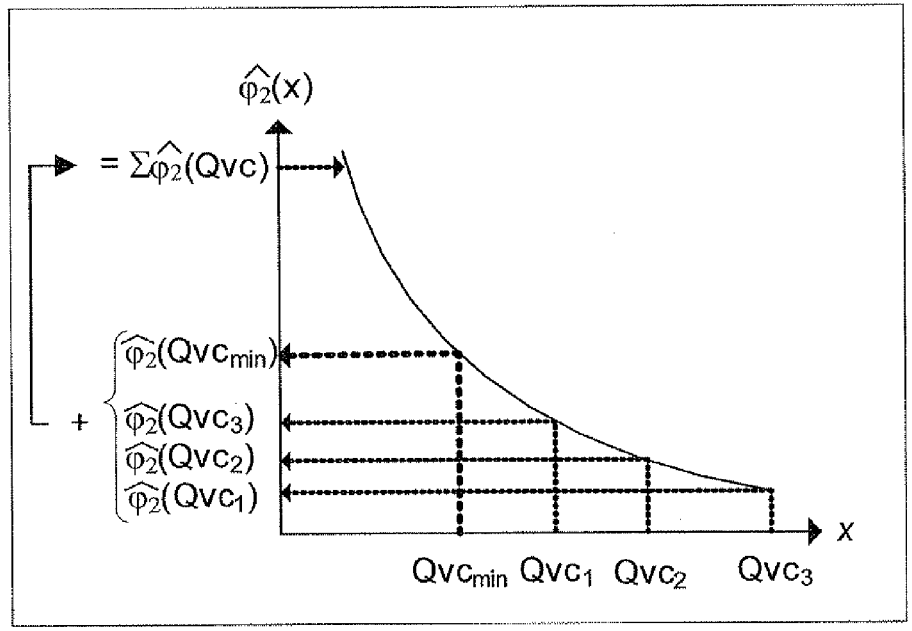
FIGS. 7 and 8 are a graphical representation of Theorem 1.

With inequality (4.14) Theorem-1 is proven. The immediate advantage of Theorem-1 is that in order to reconstruct all $R_{cv}$ messages in one check node all we need to keep in the memory is $R_c$ as defined in the statement of Theorem-1 at (3.1), for each $v \neq v_{min}$ we keep only one bit stating of $R_{cv}$ whether $|R_{cv}|=|R_c|$ or $|R_{cv}|=|R_c|+1$ and for $v_{min}$ we keep separately $R_{cv_{min}}^{max}$ (the 'min' in $R_{cv_{min}}^{max}$ indicates that the corresponding $Q_{vc}^{min}$ message entering the check node is the minimal value $Q_{vc}$ among all $Q_{vc}$ messages entering the check node; the 'max' in $R_{cv_{min}}^{max}$ n indicates that the resulting $R_{cv}$ message sent on the edge that $Q_{vc}^{min}$ arrived on is the maximal value message sent from this check node from among all other $R_{cv}$ messages sent from this check node). A graphical representation of this observation (Theorem-1) is provided in FIGS. 7 and 8. In FIG. 7 the transformation from the x-domain to the $\hat{\varphi}_2(x)$ domain is depicted. It is clear that maximal value in $\hat{\varphi}_2(x)$ domain belongs obviously to $Q_{vc}^{min}$.

Figure 1:
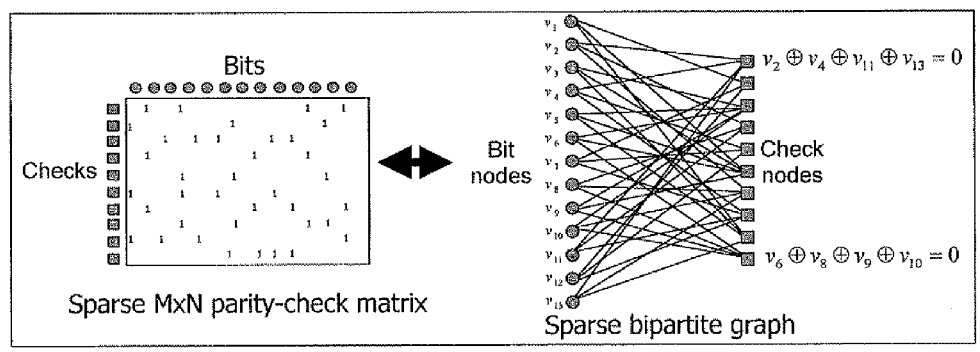
FIG. 1 illustrates the equivalence between a sparse parity check matrix and a sparse bipartite graph.
Figure 8:
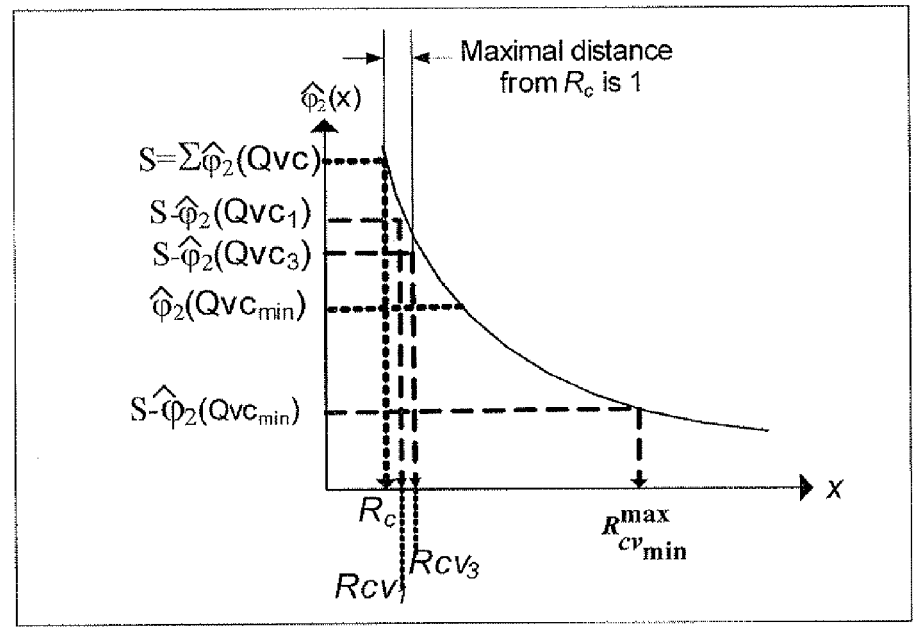

In FIG. 8 we go back from the $\hat{\varphi}_2(x)$ domain to the x-domain computing the $R_{cv}$ messages. At each edge 'k' in the graph (see FIG. 1) a $Q_{vc-k}$ message is passed from a variable node to a check node. In the other direction on the same edge, a message $R_{cv-k}$ is sent from the check node to the variable node. In FIG. 8 it is emphasized that all $R_{cv}$ messages (excluding $R_{cv_{min}}^{max}$) are at most at distance '1' from $R_c$. Therefore it is sufficient for our memory to keep $R_c$, $R_{cv_{min}}^{max}$ the index of $R_{cv_{min}}^{max}$ (i.e. which of the messages sent from the check node is the message corresponding to $R_{cv_{min}}^{max}$) and one bit for all other $R_{cv}$ messages indicating for each of these messages if the magnitude of that message is equal to $|R_c|$ or equal to $|R_c|+1$. In addition, for each of the $R_{cv}$ messages we need to store the sign bit.

It is now clear that the saving in memory usage increases as the number of $R_{cv}$ messages kept per check node is increased. This number is denoted as $d_c$, the check node degree.

Let us assume that in a fixed point implementation of the BP decoding algorithm, we use a (1.n.m) uniform quantization of the messages: each message is represented by one sign bit, n integer bits and m fractional bits. Consider a check node c connected to d, variable nodes (i.e. $|N(c,G)|=d_c$). According to conventional fixed point implementations of the BP decoding algorithm, we need a memory of $d_c \cdot (1+n+m)$ bits in order to store all messages in one check node $\{R_{cv}, \forall v \in N(c,G)\}$. However, in the present method, utilizing the property proven in Theorem-1, the messages of one check node $\{R_{cv}, \forall v \in N(c,G)\}$ are stored using only $$\underbrace{\frac{2(n+m)}{|R_c|,|R_{cv_{min}}|}}_{} + \underbrace{\frac{(d_c-1)(m+1)}{\forall v \neq v_{min}: |R_{cv}|-|R_c|}}_{} + \underbrace{\frac{d_c}{\forall v: Sign(R_{cv})}}_{} + \underbrace{\lceil \log_2(d_c) \rceil}_{index\ of\ v_{min}} bits.$$

Figure 4:
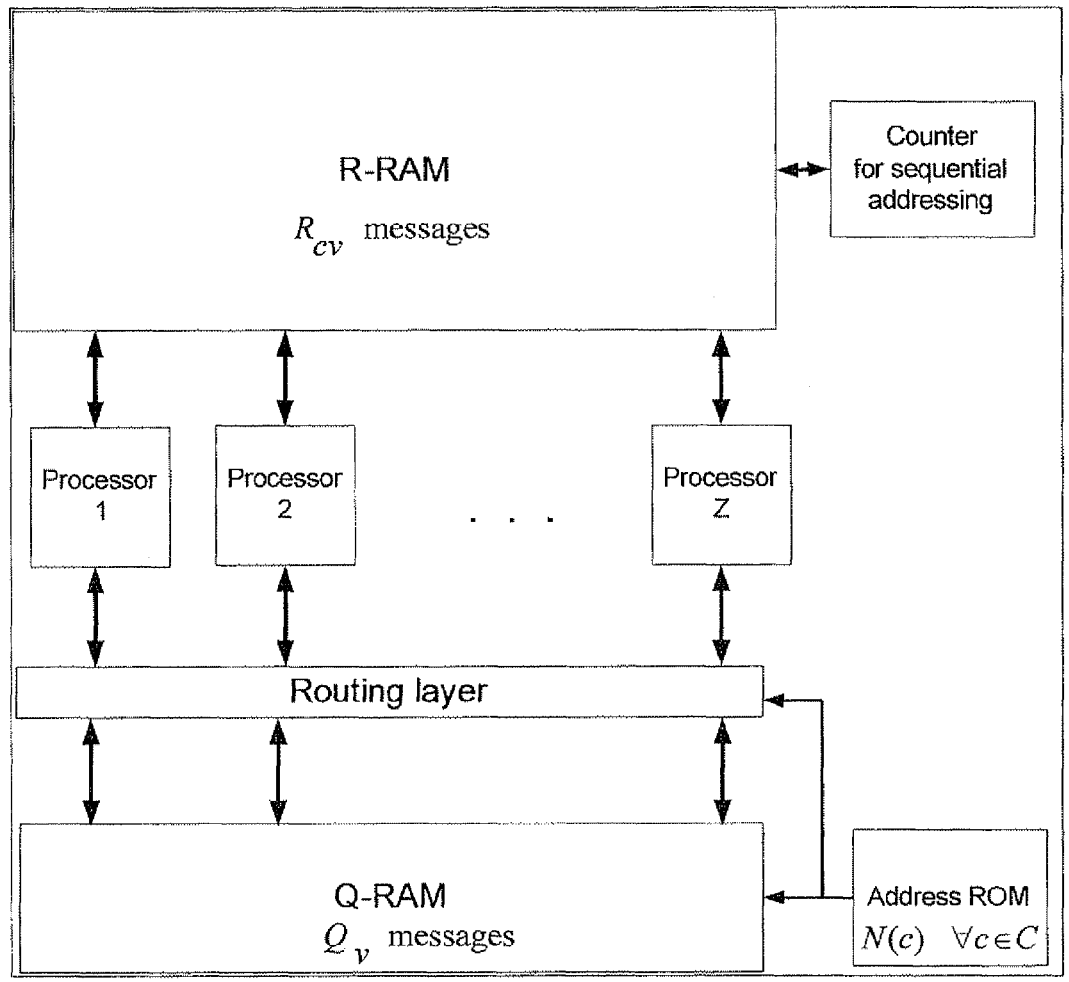
FIG. 4 illustrates the basic architecture and data path of a serial scheduler message passing decoder.
Figure 5:
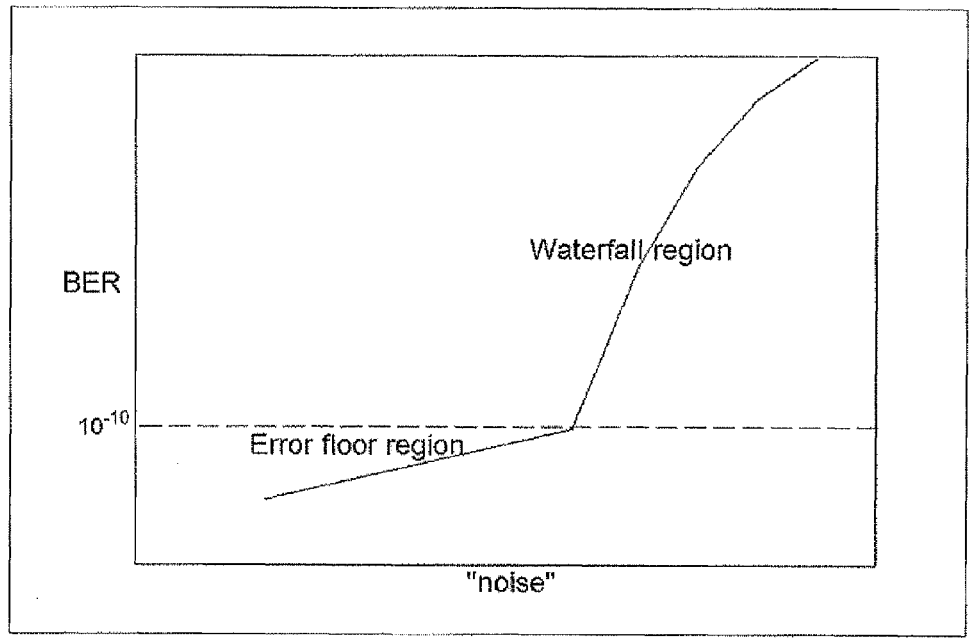
FIG. 5 illustrates the error floor phenomenon.

If all check nodes have $d_c$ neighbors the size of the decoder R-RAM memory, shown in FIG. 4, is reduced by a factor of:

$$\frac{2 \cdot n + (d_c+1) \cdot m + 2 \cdot d_c - 1 + \lceil \log_2(d_c) \rceil}{d_c \cdot (1+n+m)} \quad (4.15)$$

Expression 4.15 can be simplified to:

$$1 - \frac{(d_c-2) \cdot n + 1 - m - d_c - \lceil \log_2(d_c) \rceil}{d_c \cdot (1+n+m)} \quad (4.16)$$

Figure 9:
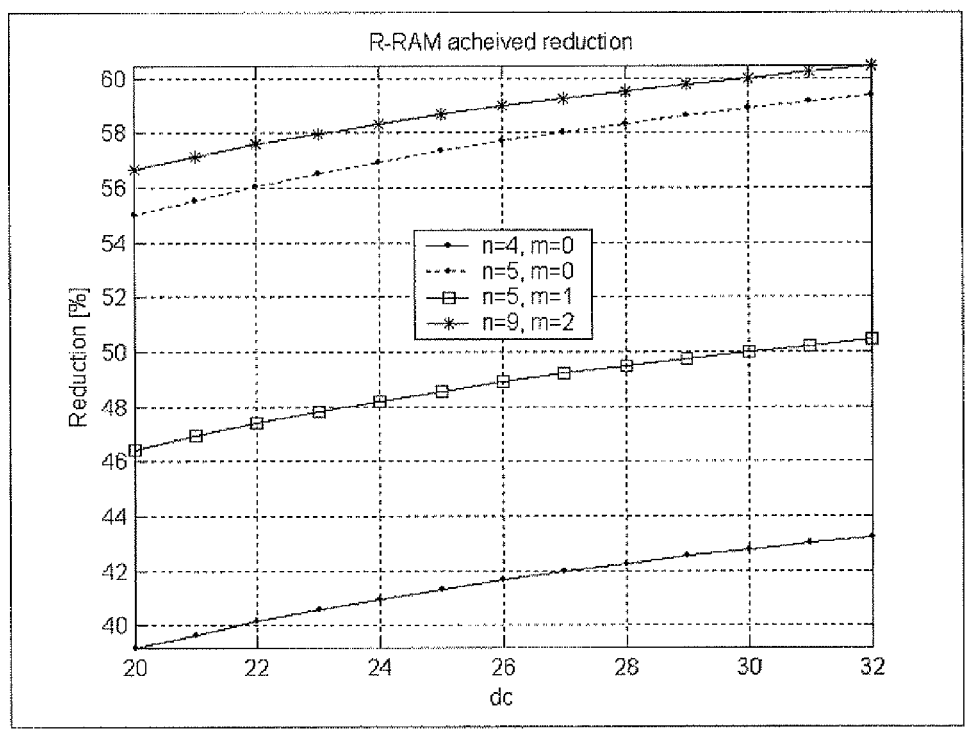
FIG. 9 shows R-RAM memory reduction as a function of '$d_c$'.

FIG. 9 presents the portion of R-RAM (in percent) reduction as function of '$d_c$' for several values of 'n' and 'm' while '$d_c$' is set from 20 to 32.

Denoting the code rate as 'r' and assuming a LDPC code with an average node degree $\bar{d}_v$ and an average check degree $\bar{d}_c$, then the code rate is:

$$r = 1 - \frac{\bar{d}_v}{\bar{d}_c} \quad (4.17)$$

Assuming that $\bar{d}_v$ is kept constant, then as the code rate increases, $\bar{d}_c$ increases too, so that the present method is particularly useful for high rate codes. If the code length is $N_v$ and the number of independent check nodes is $N_c$ then the rate can also be expressed as:

$$r = 1 - \frac{N_c}{N_v} \quad (4.18)$$

From equations (4.17) and (4.18) we conclude that:

$$\frac{\bar{d}_v}{\bar{d}_c} = \frac{N_c}{N_v} \quad (4.19)$$

Assuming that a conventional serial decoder keeps for each $Q_v$ message 2+n+m bits in the Q-RAM then the combined Q-RAM and R-RAM is reduced by factor of:

$$\frac{\{2 \cdot n + (d_c + 1) \cdot m + 2d_c - 1 + \lceil \log_2(d_c) \rceil\} \cdot}{d_c \cdot (1 + n + m) \cdot N_c + N_v \cdot (2 + m + n)} \quad (4.20)$$

Introducing equation (4.19) into equation (4.20), this reduction factor is:

$$\frac{\{2 \cdot n + (\overline{d_c} + 1) \cdot m + 2 \cdot \overline{d_c} - 1 + \lceil \log_2(\overline{d_c}) \rceil\} \cdot}{\overline{d_c}^2 \cdot (1 + n + m) + \overline{d_v} \cdot (2 + m + n)} \quad (4.21)$$

Introducing equation (4.17) back into equation (4.21), the reduction as function of code rate 'r' and '$d_c$' is therefore:

$$\frac{\{2 \cdot n + (\overline{d_c} + 1) \cdot m + 2 \cdot \overline{d_c} - 1 + \lceil \log_2(\overline{d_c}) \rceil\} +}{\overline{d_c} \cdot (1 + n + m) + (1 - r) \cdot (2 + m + n)} \quad (4.22)$$

Figure 10:
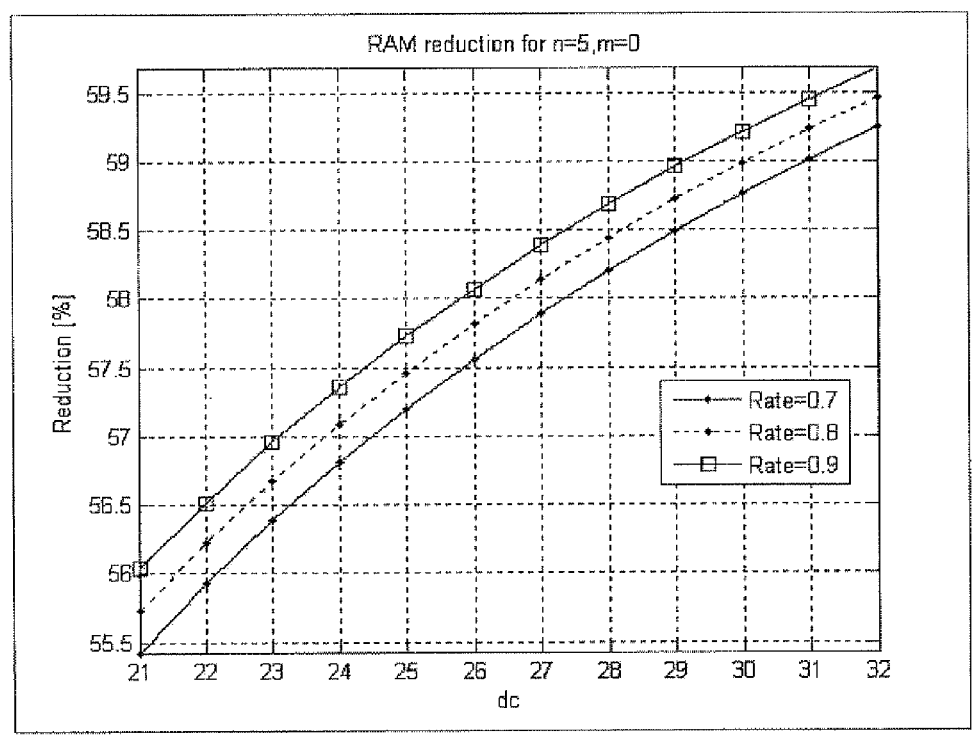
FIG. 10 shows total RAM memory reduction as a function of '$d_c$'.

FIG. 10 shows the total RAM size reduction according to equation (4.22) for several code rates for $d_c$ values from 20 to 32 as in FIG. 9, employing the case of n=5, m=0. As can be seen in FIG. 10, the R-RAM reduction factor is larger for high rate LDPC codes, in which $d_c$ is high. Consider for example the rate 0.8413 RS-LDPC, defined in the IEEE802.3an standard. This code has $d_c$=32. Furthermore, assume a fixed point implementation with message quantization of (1.n.m)= (1.5.0). Simulation results show that such a quantization provides near optimal results, i.e., negligible degradation compared to an equivalent conventional floating point BP decoder. For this example, the R-RAM size according to the method presented herein requires 40.63% of the R-RAM size needed by the conventional implementation.

Note that the R-RAM is the largest memory in the decoder, hence, in this example the total decoder memory size according to the method presented herein should be ~50%-55% of the total decoder memory size of a conventional decoder. Moreover, the reduction in the R-RAM memory size also affects the decoder's power consumption, because in each clock fewer bits are driven over the R-RAM data busses.

Next, we describe two exemplary embodiments of the decoding method and decoder described herein. Each of these embodiments exemplifies a different aspect of the method. The first embodiment is exemplifies a decoder based on the flooding scheduler. The second embodiment exemplifies a serial scheduler.

For sake of simplicity and without loss of generality, we assume that the decoder uses a single processing unit. Furthermore, we assume that the LDPC code is right regular, i.e., that the number of 1's in each row of its parity-check matrix (or the number of edges emanating from each check node in its underlying bipartite graph representation) is constant and equal to $d_c$. Generalizing the described decoder architecture for supporting more processing units and/or irregular LDPC codes is straightforward and known to those skilled in the art. We also assume that the message quantization is (1.n.0), i.e., that a "floating point" message is quantized into the closest integer in the span $[-(2^n-1):2^n-1]$ and the fractional part is 0.

This is true for storing messages in the memory, however higher resolution may be applied during messages update procedure in the processing unit.

Figure 11:
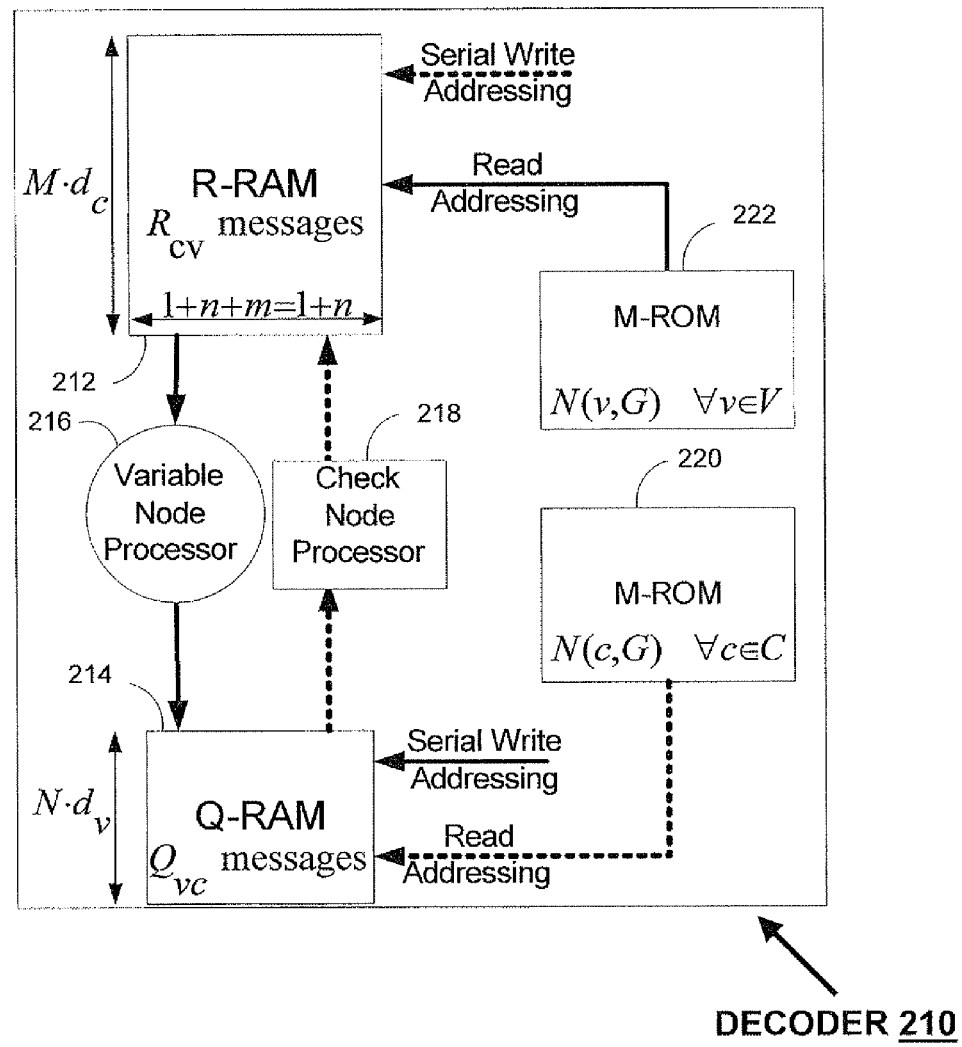
FIG. 11 illustrates the basic architecture and data path of a conventional decoder for implementing a fixed point version of a flooding schedule belief propagation algorithm.

The basic architecture and data path of a conventional decoder 210 is illustrated in FIG. 11. A conventional decoder 210 implements a fixed point version of the flooding schedule BP decoder described in FIG. 2. In each decoding iteration (defined as a single update of all messages), conventional decoder 210 processes all the parity-checks using a check node processor 218, and then processes all the variable nodes using a variable node processor 216. In support of this processing, representations of the non-zero elements of the parity-check matrix are stored in matrix ROMs (M-ROMs) 220 and 222. Alternatively, decoder 210 can be set to process all the variable nodes first in each iteration and only then process all the check nodes.

The architecture illustrated in FIG. 11 can also process the variable nodes and the check nodes at the same time provided that either the read clock is separated from the write clock or both Q-RAM 214 that holds the $Q_{vc}$ messages and R-RAM 212 that holds the $R_{cv}$ messages are set to be dual port RAMs. According to this embodiment each parity-check node is processed during $d_c$ consecutive clocks and each variable check node is processed during $d_v$ consecutive clocks.

Because E=N×$d_v$=M×$d_c$ edges are traversed during each iteration, all $Q_{vc}$ and all $R_{cv}$ message updates require the same amount of clocks, while the update of a single variable node requires fewer clocks on average compared to the average number of clocks required to update a single check node (because there always are fewer check nodes than variable nodes). The update messages are written back to the appropriate memory: the updated $Q_{vc}$ messages are written back to Q-RAM 214 while the updated $R_{cv}$ messages are written back to R-RAM 212.

Figure 12:
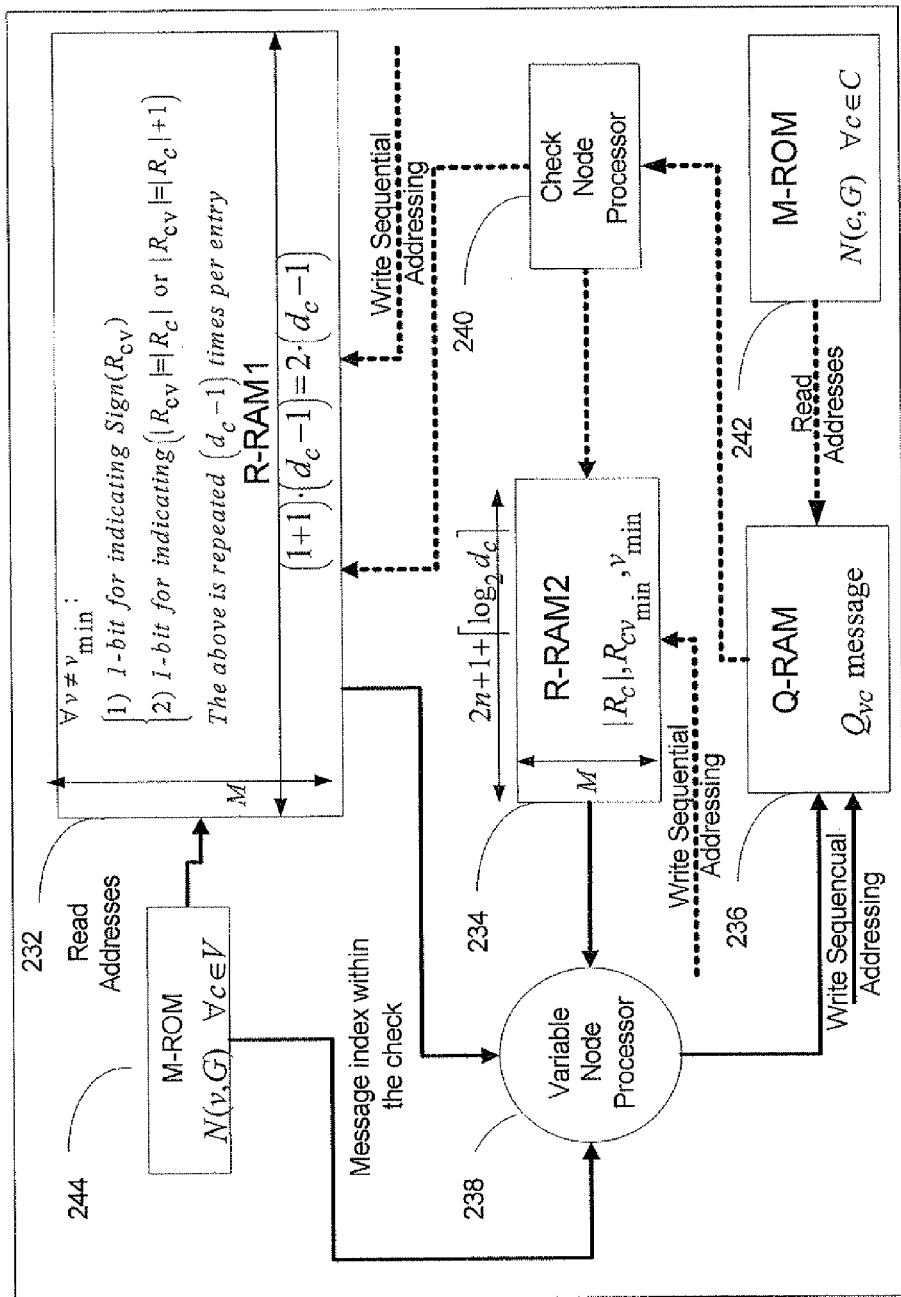
FIG. 12 illustrates the basic architecture and data path of a decoder that operates with reduced memory requirements for implementing a fixed point version of a flooding schedule belief propagation algorithm.

A basic decoder architecture and a decoder data path according to a flooding schedule embodiment of the method presented herein is illustrated in FIG. 12. A reduced memory decoder 230 according to this embodiment implements the same fixed point version of the BP decoder described in FIG. 2 as is implemented conventionally in decoder 210. Decoder 230 uses a check node processor 240 to process the parity-checks one after the other and a variable node processor 238 to process the variable nodes one after the other. Each parity-check is processed during $d_c$ consecutive clocks, on the average. Each variable node is processed during $d_v$ consecutive clocks. As in conventional decoder 210, representations of the non-zero elements of the parity-check matrix are stored in matrix ROMs (M-ROMs) 242 and 244 and the $Q_{vc}$ messages are stored in a Q-RAM 236.

However, the $R_{cv}$ messages are stored "compressed" in two memories: R-RAM1 232 and R-RAM2 234. Each memory address in R-RAM1 232 stores two bits, one bit indicating the sign of the corresponding $R_{cv}$ message and one bit indicating whether $|R_{cv}|=|R_c|$ or $|R_{cv}|=|R_c|+1$. For every parity-check node, R-RAM1 232 contains $d_c-1$ elements, each element contains information regarding one of the $R_{cv}$ messages related to the parity-check node other than the $R_{cv_{min}}$ message. R-RAM2 memory 234 has M addresses, one address for each parity-check node. Each memory address in R-RAM2 234 stores the $R_{cv_{min}}$, $|R_c|$ and $v_{min}$ index related to one of the parity-checks. Hence, each R-RAM2 234 address stores $2n+1+\lceil \log_2 d_c \rceil$ bits.

Q-RAM 236 holds, as in conventional decoder 210, N×$d_v$ entries. Every set of consecutive $d_v$ messages are the $Q_{vc}$ messages sent from one variable node.

Note that in decoder 230 we process a parity-check node by processing its related messages one by one (i.e. reading the messages into the processor one message per clock cycle). It is also possible to process the parity-check messages in parallel in order to increase the throughput of the decoder.

FIG. 13 presents the variable node processor algorithm for the decoder 230. The main difference compared with the algorithm of FIG. 2 is the reconstruction of $R_{cv}$ messages from their corresponding representation in memories R-RAM1 232 and R-RAM2 234.

FIG. 14 presents the check node processor algorithm of decoder 230. The main difference compared with the algorithm of FIG. 2 is the storing of the $R_{cv}$ messages in the R-RAM1 232 and R-RAM-2 234. The $R_{cv}$ messages are stored in their "compressed" forms. Note that this compression does not lose any information.

The second embodiment exemplifies a decoder based on serial scheduler in which the computation part of the serial scheduler is maintained intact, while the storing and loading of $R_{cv}$ is provided according to the method presented herein.

Figure 15:
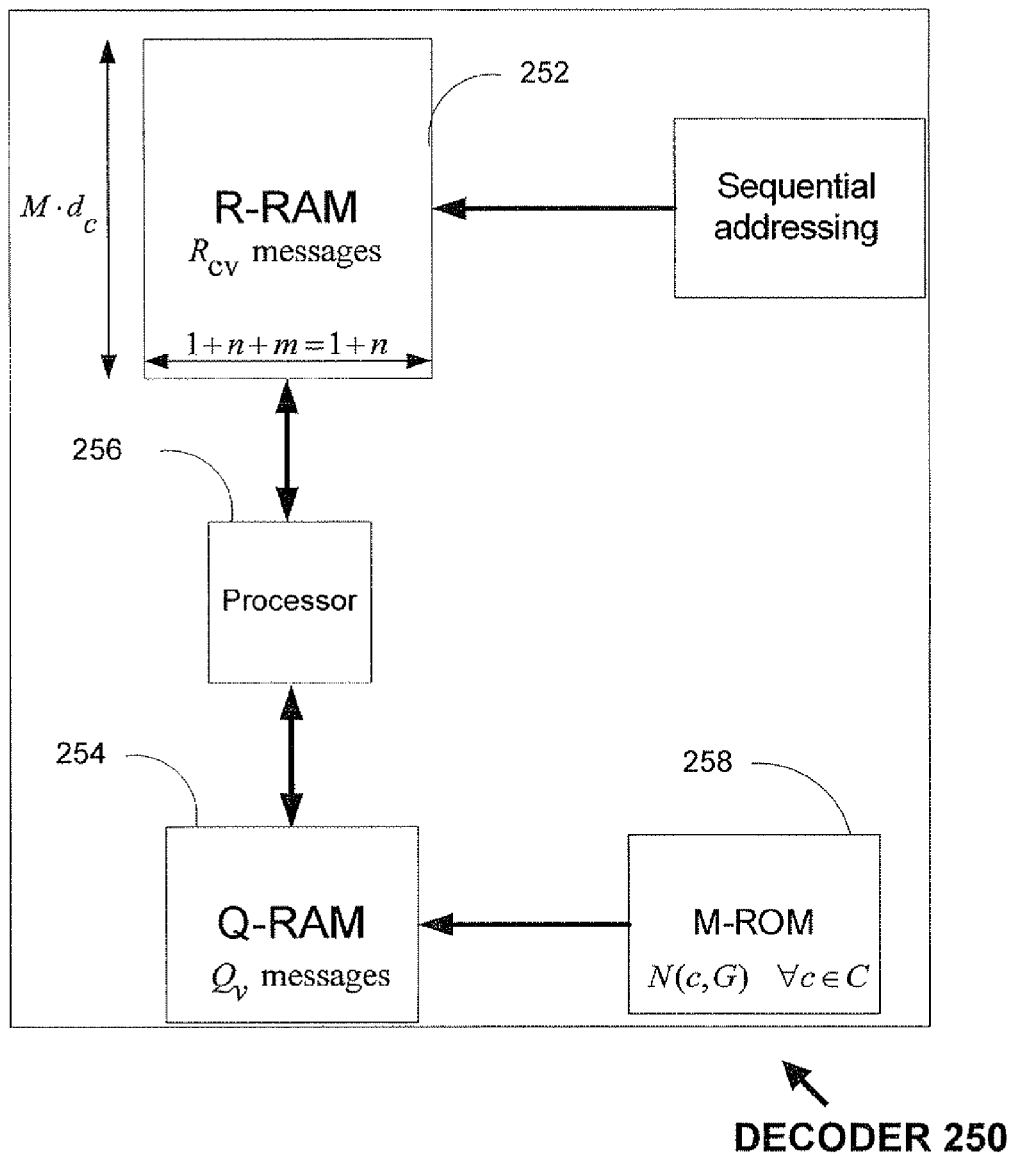
FIG. 15 illustrates the basic architecture and data path of a conventional decoder for implementing a fixed point version of a serial schedule belief propagation algorithm.

A basic decoder architecture and a data path of a corresponding conventional serial schedule decoder 250 is shown in FIG. 15. Decoder 250 implements a fixed point version of the serially scheduled BP decoder algorithm presented in FIG. 3. Decoder 250 processes the parity-check nodes one after another ("Sequential addressing"). Each parity-check node is processed during $d_c$ consecutive clocks. During each clock, a single $Q_v$ message and a single $R_{cv}$ message are read from a Q-RAM memory 254 and a R-RAM memory 252, respectively, and are routed into a processor 256. One of the advantages of the serial scheduler is that instead of keeping all M×$d_c$ messages ($Q_{vc}$) only N messages (holding $Q_v$) are kept while the $Q_{vc}$ messages are computed on the fly.

Processor 256 updates the messages and writes the messages back into memories 252 and 254. This procedure is designed such that in each clock a new set of messages are read and written from/to memories 252 and 254.

Figure 16:
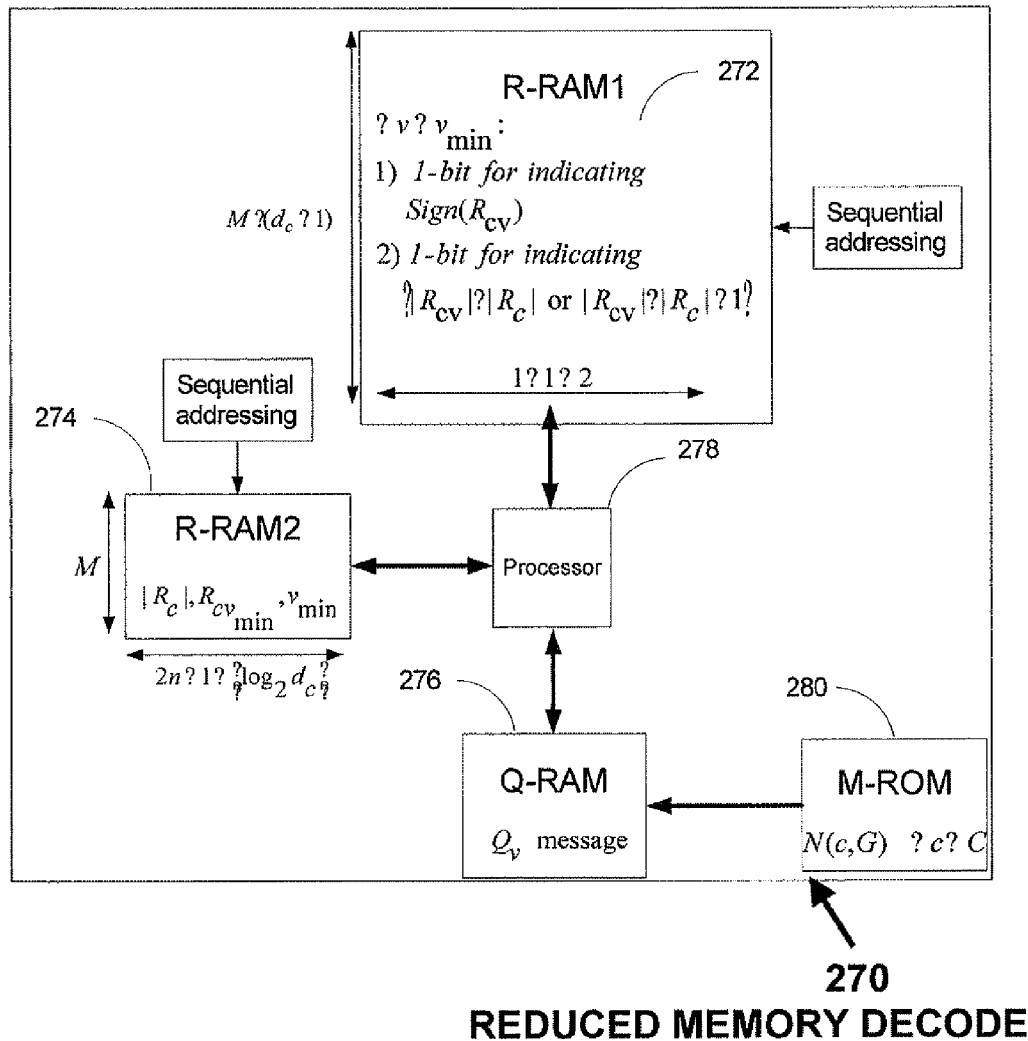
FIG. 16 illustrates a basic architecture and data path of a decoder with reduced memory requirements for implementing a fixed point version of a serial schedule belief propagation algorithm.

A basic architecture and a data path of a reduced memory decoder 270 according to the serial schedule embodiment of the method presented herein is illustrated in FIG. 16. Decoder 270 implements the same fixed point version of the serially schedule BP decoder described in FIG. 3 as is implemented conventionally in decoder 250. Decoder 270 processes the parity-checks one after another ("sequential addressing"). Each parity-check is processed during $d_c$ consecutive clocks. During each clock, a single $Q_v$ message is read from a Q-RAM memory 276. However, the $R_{cv}$ messages are stored "compressed" in two memories: R-RAM1 272 and R-RAM2 274. Each memory address in R-RAM1 272 stores two bits, one bit indicating the sign of the $R_{cv}$ message and one bit indicating whether $|R_{cv}|=|R_c|$ or $|R_{cv}|=|R_c|+1$. For every parity-check node, R-RAM1 272 contains $d_c-1$ addresses, each address contains information regarding one of the $R_{cv}$ messages related to the parity-check besides the $R_{cv_{min}}$ message. R-RAM2 memory 274 has M addresses, one address for each parity-check node. Each memory address in R-RAM2 274 stores the $R_{cv_{min}}$, $|R_c|$ and $v_{min}$ index related to one of the parity-check nodes. Hence, each R-RAM2 274 address stores 2 n+1+⌈$\log_2 d_c$⌉ bits.

In the embodiment of FIG. 16 we process a parity-check by processing its related messages one by one (i.e. by reading the messages into the processor one message per clock cycle). It is also possible to process the messages in parallel in order to increase the throughput of the decoder. It also is possible to process the variable nodes one by one and reconstruct at each clock the corresponding $R_{cv}$ message thus implementing a variable node serial scheduler instead of a check node serial scheduler. However it is more efficient to use a check node serial scheduler in this case because R-RAM2 274 is read only once for reconstructing $d_c$ message while in the case of variable node serial scheduler it is required to read R-RAM2 274 for each reconstructed $R_{cv}$ message independently because in the variable node serial scheduler each $R_{cv}$ is related to a different check node and hence has separate set of $R_c$, $R_{cv_{min}}$ and $V_{min}$ values. Nevertheless it is still possible to use the compressed form of storing $R_{cv}$ messages as illustrated in FIG. 16.

Figure 17:
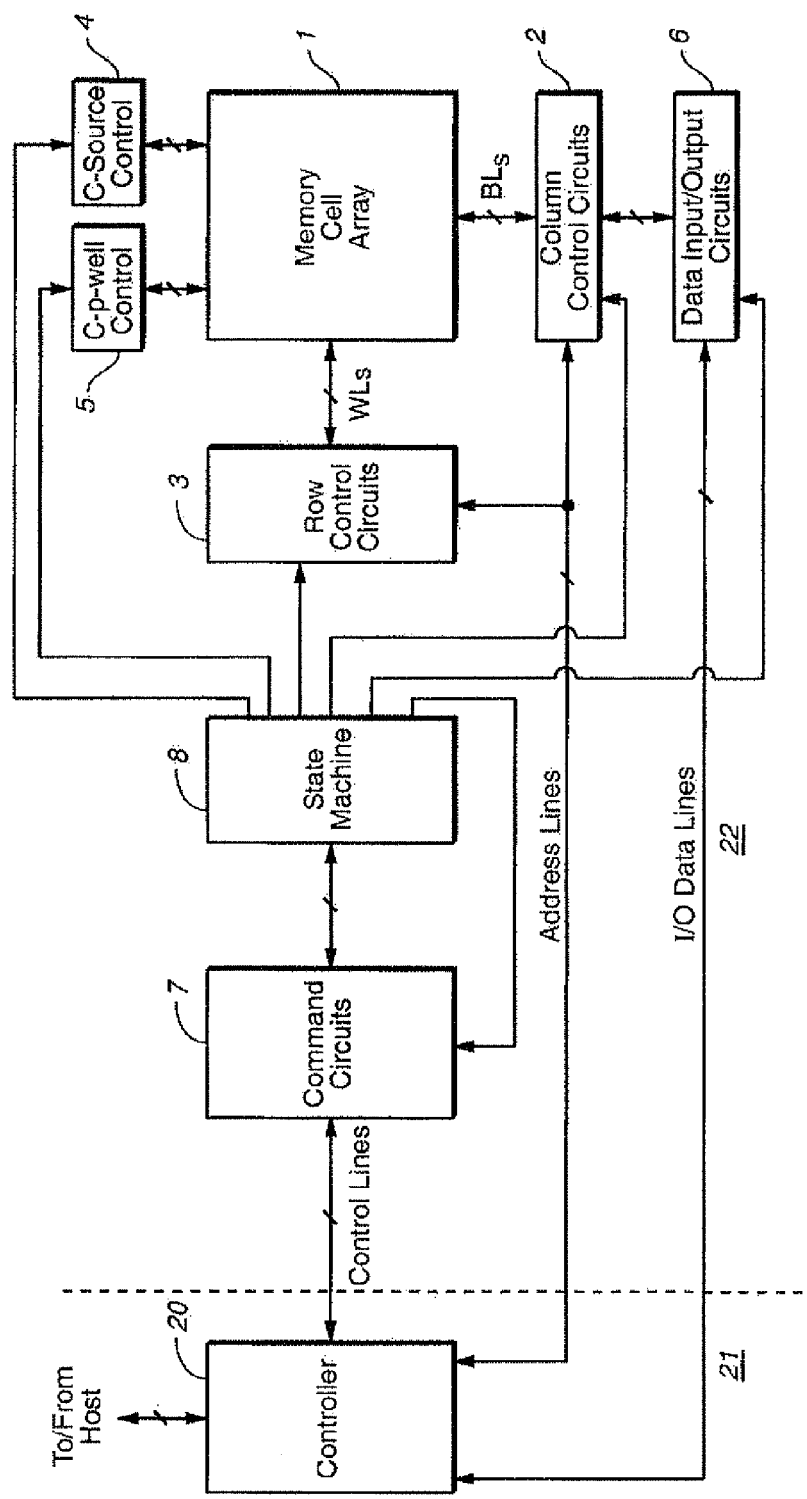
FIG. 17 is a high-level schematic block diagram of a flash memory device whose controller includes a reduced-memory decoder.

FIG. 17 is a high-level schematic block diagram of a flash memory device. A memory cell array 1 that includes a plurality of memory cells arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells of array 1, for determining a state of the memory cells of array 1 during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells of array 1 are formed. C-source control circuit 4 controls a common source line connected to the memory cells of array 1. C-p-well control circuit 5 controls the c-p-well voltage.

The data stored in the memory cells of array 1 are read out by column control circuit 2 and are output to external I/O lines via I/O data lines and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contains a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 18:
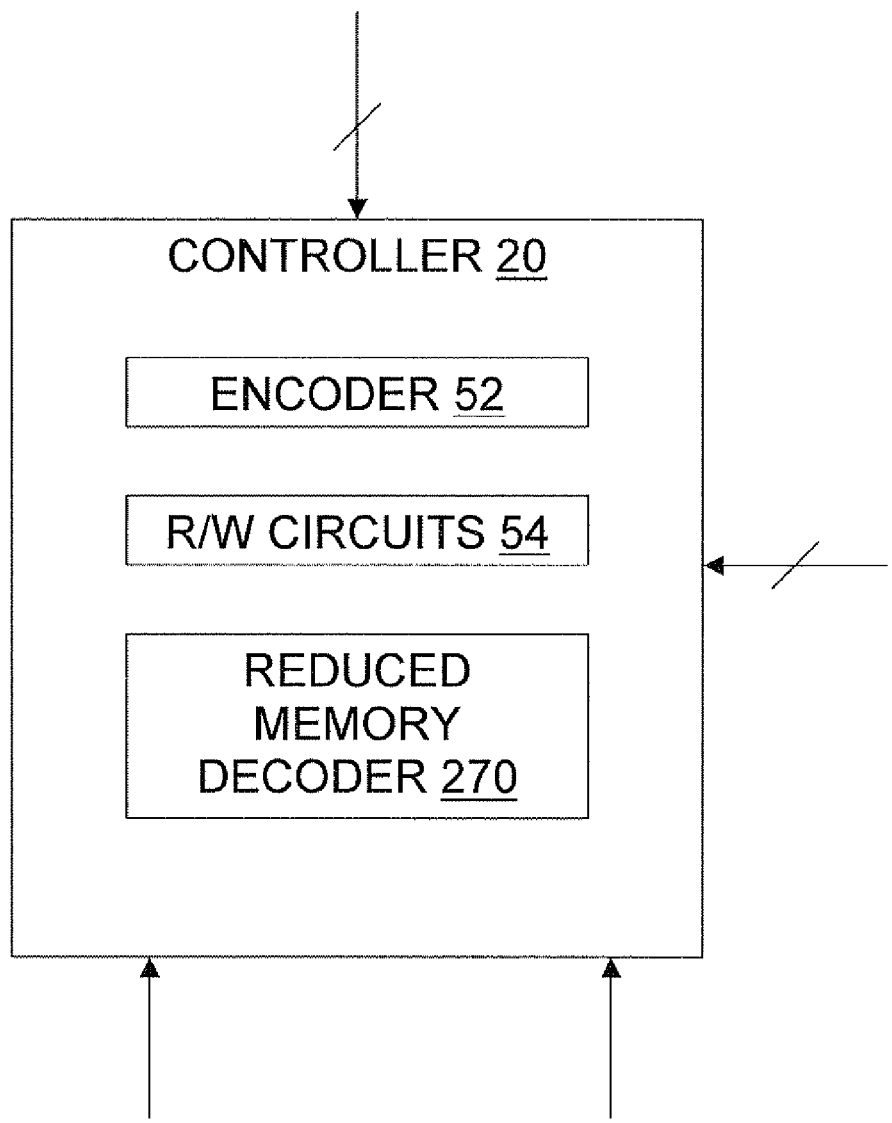
FIG. 18 is a high-level partial schematic block diagram of the controller of the flash memory device of FIG. 17.

FIG. 18 is an enlarged view of part of FIG. 17, showing that controller 20 includes an encoder 52 for encoding user data received from the host as one or more codewords, circuitry 54 for instructing command circuits 7 of FIG. 17 to store the codewords (or only the non-punctured bits thereof, if any of the bits of the codewords are punctured bits) in memory cell array 1 of FIG. 17 and for instructing command circuits 7 of FIG. 17 to retrieve the stored codewords (or the stored portions thereof in the punctured bit case) from memory cell array 1 of FIG. 23, and reduced memory decoder 270 for decoding the manifestation of the codewords as retrieved by circuitry 54. Alternatively, controller 20 could include reduced memory decoder 230 instead of reduced memory decoder 270.

Although the methods and the decoders disclosed herein are intended primarily for use in data storage systems, these methods and decoders also are applicable to communications systems, particularly communications systems that rely on wave propagation through media that strongly attenuate some frequencies. Such communication is inherently slow and noisy. One example of such communication is extremely low frequency radio wave communication between shore stations and submerged submarines.

Figure 19:
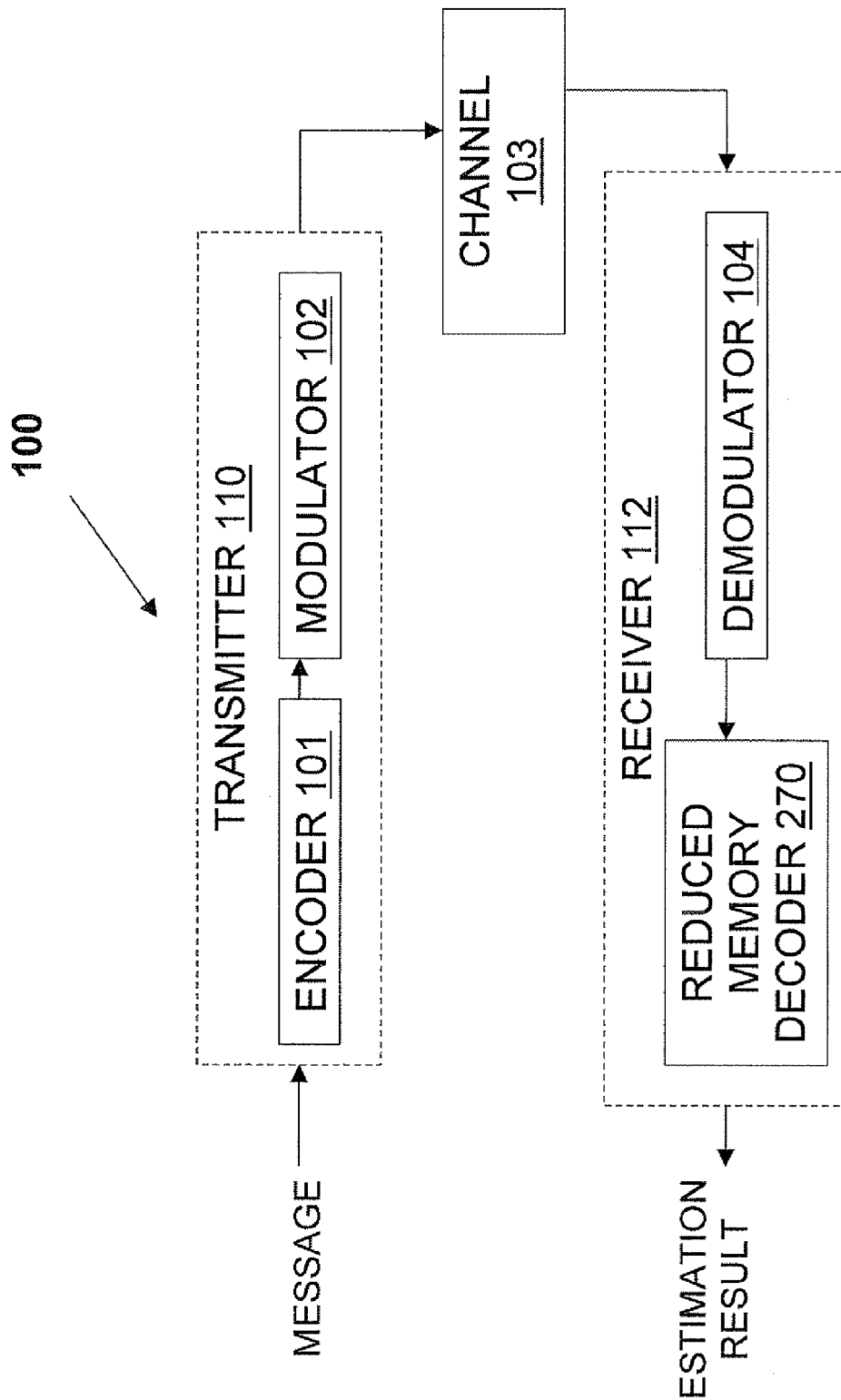
FIG. 19 is a high-level schematic block diagram of a communication system whose receiver includes a reduced-memory decoder.

FIG. 19 is a high-level schematic block diagram of a communication system 100 that includes a transmitter 110, a channel 103 and a receiver 112. Transmitter 110 includes an encoder 101 and a modulator 102. Receiver 112 includes a demodulator 104 and reduced memory decoder 270. Encoder 101 receives a message and generates a corresponding codeword. Modulator 102 subjects the generated codeword to a digital modulation such as BPSK, QPSK, multi-valued QAM or OFDM and transmits the resulting modulated signal to receiver 112 via channel 103. At receiver 112, demodulator 104 receives the modulated signal from channel 103 and subjects the received modulated signal to a digital demodulation such as BPSK, QPSK or multi-valued QAM. Decoder 270 decodes the resulting manifestation of the original codeword as described above. Alternatively, receiver 112 could include decoder 230 instead of decoder 270.

A limited number of embodiments of methods for storing control metadata of a flash memory, and of a device and system that use the methods, have been described. It will be appreciated that many variations, modifications and other applications of the methods, device and system may be made.

What is claimed is:

1. A method of decoding a manifestation of a codeword in which K information bits are encoded as N>K codeword bits, the method comprising: (a) updating estimates of the codeword bits by steps including: in a graph that includes N bit nodes and N−K check nodes, exchanging messages between the bit nodes and the check nodes during at least one message exchange iteration; (b) defining a full message length greater than two bits with which individual messages, transmitted between the bit nodes and check nodes, are expressed during computation; and (c) in each iteration, storing representations of at least a portion of the messages that are exchanged between the bit nodes and the check nodes; wherein, for at least one of the bit nodes or check nodes, if representations of the messages that are sent from the bit nodes or check nodes during one of the at least one iteration are stored, then the representation of at least one of the messages is stored using at least two bits but using fewer bits than the full message length.

2. The method of claim 1, wherein the representation of one other message that is sent from the at least one bit node or check node during the one iteration is stored with the full message length.

3. The method of claim 2, wherein all the messages sent from the bit node or check node during the one iteration except the one other message are stored using at least two bits but using fewer bits than the full message length.

4. The method of claim 1, wherein the representation of the at least one message is stored using exactly two bits.

5. The method of claim 1, wherein the node for which the representation of at least one of the messages is stored using at least two bits but using fewer bits than the fill message length is a check node.

6. The method of claim 5, wherein representations of all the messages that are sent from the check nodes during one of the at least one iteration are stored, and wherein, for each check node, the representation of at least one of the messages that is sent from that check node is stored using at least two bits but using fewer bits than the full message length and the representation of one other message that is sent from that check node is stored with the full message length.

7. The method of claim 1, wherein, for each node for which representations of the messages that are sent from the bit node or check node during one of the at least one iteration are stored, the representation of at least one of the messages that is sent from the bit node or check node is stored using at least two bits but using fewer bits than the full message length and the representation of one other message that is sent from that node is stored with the full message length.

8. The method of claim 1, wherein, for at least one of the bit nodes or check nodes, in each of the at least one iteration in which representations of the messages that are sent from the bit node or check node are stored, the representation of at least one of the messages is stored using at least two bits but using fewer bits than the full message length and the representation of one other message is stored with the full message length.

9. The method of claim 1, wherein the messages are exchanged according to a belief propagation algorithm.

10. The method of claim 9, wherein the messages are exchanged according to a flooding schedule.

11. The method of claim 9, wherein the messages are exchanged according to a serial schedule.

12. A decoder for decoding a manifestation of a codeword in which K information bits are encoded as N>K codeword bits, comprising: (a) at least one memory; and (b) at least one processor for decoding the manifestation of the codeword by executing an algorithm for updating estimates of the codeword bits by steps including: (i) in a graph that includes N bit nodes and N−K check nodes, exchanging messages between the bit nodes and the check nodes during at least one message exchange iteration, individual messages transmitted between the bit nodes and check nodes being expressed during computation with a full message length greater than two bits, and (ii) storing, in the at least one memory, representations of at least a portion of the messages that are exchanged between the bit nodes and the check nodes, wherein, for at least one of the bit nodes or check nodes, if representations of the messages that are sent from the bit node or check node during one of the at least one iteration are stored, then the representation of at least one of the messages is stored using at least two bits but using fewer bits than the full message length.

13. A memory controller comprising: (a) an encoder for encoding K information bits as a codeword of N>K codeword bits; and (b) a decoder including: (i) at least one decoder memory; and (ii) at least one processor for decoding a manifestation of the codeword by executing an algorithm for updating estimates of the codeword bits by steps including: (A) in a graph that includes N bit nodes and N−K check nodes, exchanging messages between the bit nodes and the check nodes during at least one message exchange iteration, individual messages, transmitted between the bit nodes and check nodes, being expressed during computation with a full message length greater than two bits, and (B) storing, in the at least one decoder memory, representations of at least a portion of the messages that are exchanged between the bit nodes and the check nodes, wherein, for at least one of the nodes, if representations of the messages that are sent from the bit node or check node during one of the at least one iteration are stored, then the representation of at least one of the messages is stored using at least two bits but using fewer bits than the full message length.

14. The memory controller of claim 13, further comprising:
(c) circuitry for storing at least a portion of the codeword in a main memory and for retrieving a manifestation of the at least portion of the code word from the main memory.

15. A memory device comprising:
(a) the memory controller of claim 14; and
(b) the main memory.

16. A receiver comprising: (a) a demodulator for demodulating a message received from a communication channel, thereby providing a manifestation of a codeword in which K information bits are encoded as N>K codeword bits; and (b) a decoder including: (i) at least one memory; and (ii) at least one processor for decoding the manifestation of the codeword by executing an algorithm for updating estimates of the codeword bits by steps including: (A) in a graph that includes N bit nodes and N–K check nodes, exchanging messages between the bit nodes and the check nodes during at least one message exchange iteration, individual messages, transmitted between the bit nodes and check nodes, being expressed during computation with a full message length greater than two bits, and (B) storing, in the at least one memory, representations of at least a portion of the messages that are exchanged between the bit nodes and the check nodes, wherein, for at least one of the bit nodes or check nodes, if representations of the messages that are sent from that node during one of the at least one iteration are stored, then the representation of at least one of the messages is stored using at least two bits but using fewer bits than the full message length.

17. A communication system for transmitting and receiving a message, comprising: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a manifestation of the codeword, and (ii) a decoder including: (A) at least one memory; and (B) at least one processor for decoding the manifestation of the codeword by executing an algorithm for updating estimates of the codeword bits by steps including: (I) in a graph that includes N bit nodes and N–K check nodes, exchanging messages between the bit nodes and the check nodes during at least one message exchange iteration, individual messages, transmitted between the bit nodes and check nodes, being expressed during computation with a full message length greater than two bits, and (II) storing, in the at least one memory, representations of at least a portion of the messages that are exchanged between the bit nodes and the check nodes, wherein, for at least one of the nodes, if representations of the messages that are sent from the bit node or check node during one of the at least one iteration are stored, then the representation of at least one of the messages is stored using at least two bits but using fewer bits than the full message length.

18. A method of decoding a manifestation of a codeword in which K information bits are encoded as N>K codeword bits, the method comprising: (a) providing a parity check matrix having N–K rows and N columns; (b) updating estimates of the codeword bits by steps including exchanging messages between the rows and the columns of the matrix during at least one message exchange iteration; (c) defining a full message length greater than two bits with which individual messages, transmitted between the bit nodes and check nodes, are expressed during computation; and (d) storing representations of at least a portion of the messages that are exchanged between the rows and the columns; wherein, for at least one of the rows or columns, if representations of the messages that are sent from that row or column during one of the at least one iteration are stored, then the representation of at least one of the messages is stored using at least two bits but using fewer bits than the full message length.

19. A decoder for decoding a manifestation of a codeword in which K information bits are encoded as N>K codeword bits, comprising: (a) at least one memory; and (b) at least one processor for decoding the manifestation of the codeword by executing an algorithm for updating estimates of the codeword bits by steps including: (i) providing a parity check matrix having N–K rows and N columns; (ii) exchanging messages between the rows and the columns of the matirix during at least one message exchange iteration, individual messages, transmitted between the bit nodes and check nodes, being expressed with a full message length greater than two bits, and (iii) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

20. A memory controller comprising: (a) an encoder for encoding K information bits as a codeword of N>K codeword bits; and (b) a decoder including: (i) at least one memory; and (ii) at least one processor for decoding a manifestation of the codeword by executing an algorithm for updating estimates of the codeword bits by steps including: (A) providing a parity check matrix having N–K rows and N columns; exchanging messages between the rows and the columns of the matrix during at least one message exchange iteration, individual messages, transmitted between the bit nodes and check nodes, being expressed during computation with a full message length greater than two bits, and (C) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

21. The memory controller of claim 20, further comprising:
(c) circuitry for storing at least a portion of the codeword in a main memory and for retrieving a manifestation of the at least portion of the code word from the main memory.

22. A memory device comprising:
(a) the memory controller of claim 21; and
(b) the main memory.

23. A receiver comprising: (a) a demodulator for demodulating a message received from a communication channel, thereby providing a manifestation of a codeword in which K information bits are encoded as N>K codeword bits; and (b) a decoder including: (i) at least one memory; and (ii) at least one processor for decoding the manifestation of the codeword by executing an algorithm for updating estimates of the codeword bits by steps including: (A) providing a parity check matrix having N−K rows and N columns; (B) exchanging messages between the rows and the columns of the matrix during at least one message exchange iteration, individual messages, transmitted between the bit nodes and check nodes, being expressed during computation with a full message length greater than two bits, and (C) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

24. A communication system for transmitting and receiving a message, comprising: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a manifestation of the codeword, and (ii) a decoder including: (A) at least one memory; and B) at least one processor for decoding the manifestation of the codeword by executing an algorithm for updating estimates of the codeword bits by steps including: (I) providing a parity check matrix having N−K rows and N columns; (II) exchanging messages between the rows and the columns of the matrix during at least one message exchange iteration, individual messages, transmitted between the bit nodes and check nodes, being expressed during computation with a full message length greater than two bits, and (II) storing, in the at least one memory, representations of at least a portion of the messages that are exchanged between the rows and the columns, wherein, for at least one of the rows or columns, if representations of the messages that are sent from that row or column during one of the at least one iteration are stored, then the representation of at least one of the messages is stored using at least two bits but using fewer bits than the full message length.

* * * * *

UNITED STATES PATENT AND TRADEMARK OFFICE
CERTIFICATE OF CORRECTION

PATENT NO. : 8,429,512 B2
APPLICATION NO. : 12/404308
DATED : April 23, 2013
INVENTOR(S) : Sharon et al.

Page 1 of 1

It is certified that error appears in the above-identified patent and that said Letters Patent is hereby corrected as shown below:

In the Claims:

Column 22,
Line 7, "fill message" should read --full message--.

Column 26,
Line 4, "B)" should read --(B)--;
Line 13, "(II)" should read --(III)--.

Signed and Sealed this
Twentieth Day of August, 2013

Teresa Stanek Rea
*Acting Director of the United States Patent and Trademark Office*